United States Patent
Zamburg et al.

(10) Patent No.: US 11,580,285 B2
(45) Date of Patent: Feb. 14, 2023

(54) RECONFIGURABLE INTEGRATED CIRCUIT AND OPERATING PRINCIPLE

(71) Applicants: Nokia of America Corporation, Murray Hill, NJ (US); Nokia Solutions and Networks Oy, Espoo (FI)

(72) Inventors: Evgeny Zamburg, Espoo (FI); Adriaan De Lind Van Wijngaarden, Murray Hill, NJ (US); Dusan Suvakovic, Murray Hill, NJ (US)

(73) Assignees: Nokia of America Corporation, Murray Hill, NJ (US); Nokia Solutions and Networks Oy, Espoo (FI)

( * ) Notice: Subject to any disclaimer, the term of this patent is extended or adjusted under 35 U.S.C. 154(b) by 859 days.

(21) Appl. No.: 16/467,421

(22) PCT Filed: Dec. 8, 2017

(86) PCT No.: PCT/US2017/065426
§ 371 (c)(1),
(2) Date: Jun. 6, 2019

(87) PCT Pub. No.: WO2018/107101
PCT Pub. Date: Jun. 14, 2018

(65) Prior Publication Data
US 2020/0226314 A1    Jul. 16, 2020

Related U.S. Application Data

(60) Provisional application No. 62/432,345, filed on Dec. 9, 2016.

(51) Int. Cl.
| | | |
|---|---|---|
| G06F 30/347 | (2020.01) | |
| G06F 30/373 | (2020.01) | |
| H01L 27/24 | (2006.01) | |

(52) U.S. Cl.
CPC .......... *G06F 30/347* (2020.01); *G06F 30/373* (2020.01); *H01L 27/2436* (2013.01)

(58) Field of Classification Search
CPC ...... G06F 30/34; G06F 30/347; G06F 30/373; G06F 15/7867; H01L 27/2436; H01L 27/2472; H01L 45/06; H01L 45/08; H01L 45/1206; H01L 45/1226; H01L 45/142–149; H03K 19/17756
See application file for complete search history.

(56) References Cited

U.S. PATENT DOCUMENTS

| | | |
|---|---|---|
| 4,972,470 A | 11/1990 | Farago |
| 5,051,804 A | 9/1991 | Morse et al. |
| 5,668,419 A | 9/1997 | Oktay |
| 7,902,857 B1 | 3/2011 | Pino |
| 8,847,191 B1 | 9/2014 | Gallo et al. |
| 2003/0142578 A1 | 7/2003 | Hsu et al. |
| 2004/0197947 A1 | 10/2004 | Fricke et al. |
| 2008/0298113 A1 | 12/2008 | Liu et al. |

(Continued)

FOREIGN PATENT DOCUMENTS

| | | |
|---|---|---|
| CN | 102171829 A | 8/2011 |
| WO | 2015164640 A1 | 10/2015 |

(Continued)

*Primary Examiner* — Jack Chiang
*Assistant Examiner* — Aric Lin

(57) ABSTRACT

An electrical device comprising a reconfigurable integrated circuit that includes paired top electrodes and bottom electrodes separated from each other by an active layer.

12 Claims, 30 Drawing Sheets

(56) References Cited

U.S. PATENT DOCUMENTS

| | | |
|---|---|---|
| 2011/0235436 A1 | 9/2011 | Fukuzumi et al. |
| 2012/0007038 A1 | 1/2012 | Strukov et al. |
| 2012/0126195 A1 | 5/2012 | Ignatiev et al. |
| 2014/0159067 A1 | 6/2014 | Sakariya et al. |
| 2015/0103588 A1 | 4/2015 | Son |
| 2016/0079019 A1 | 3/2016 | Borodulin et al. |
| 2016/0329900 A1 | 11/2016 | Thiagarajan et al. |

FOREIGN PATENT DOCUMENTS

| | | |
|---|---|---|
| WO | 2015167438 A1 | 11/2015 |
| WO | 2018107090 A1 | 6/2018 |
| WO | 2018107101 A1 | 6/2018 |

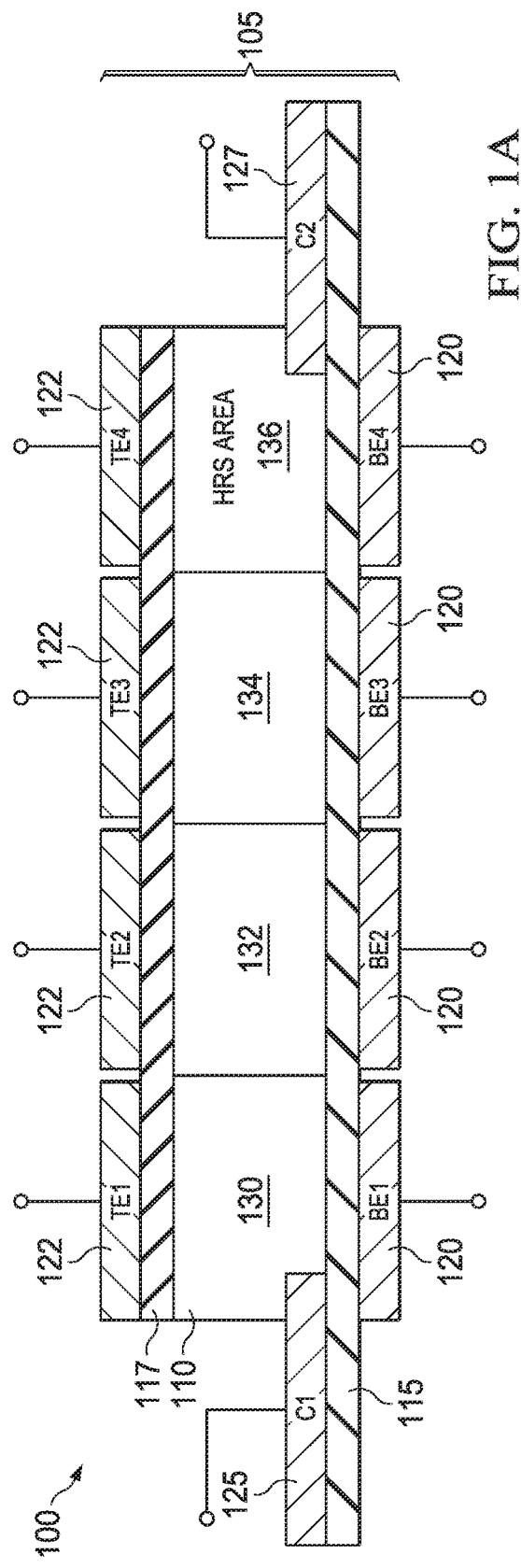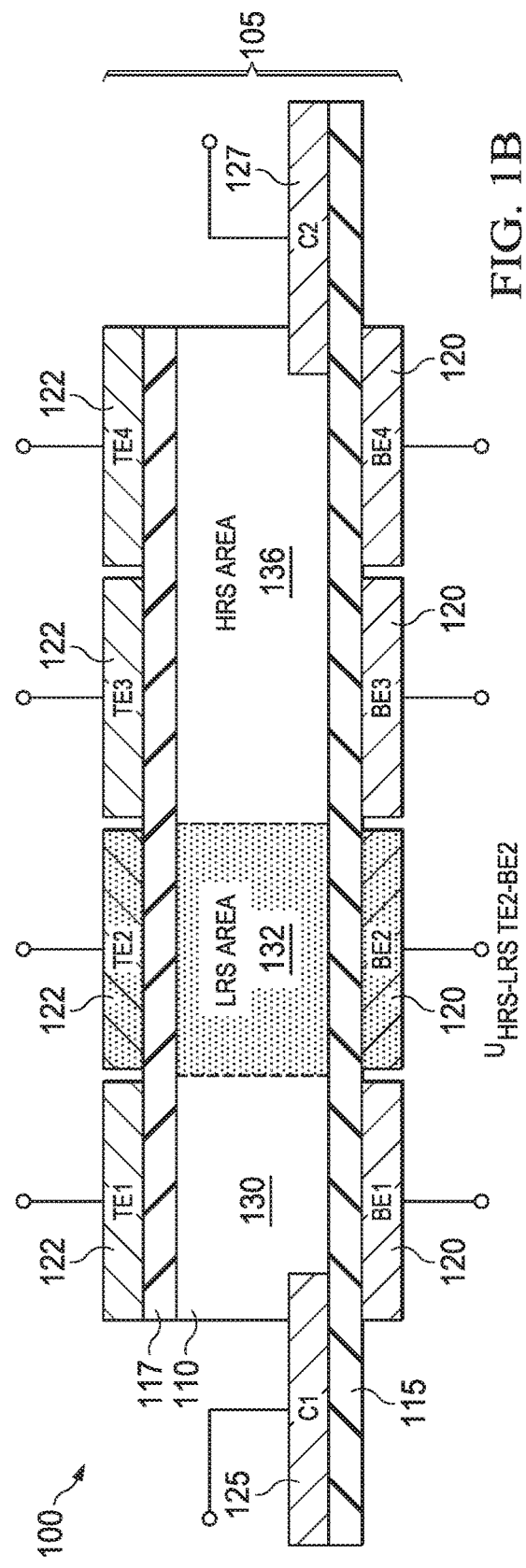

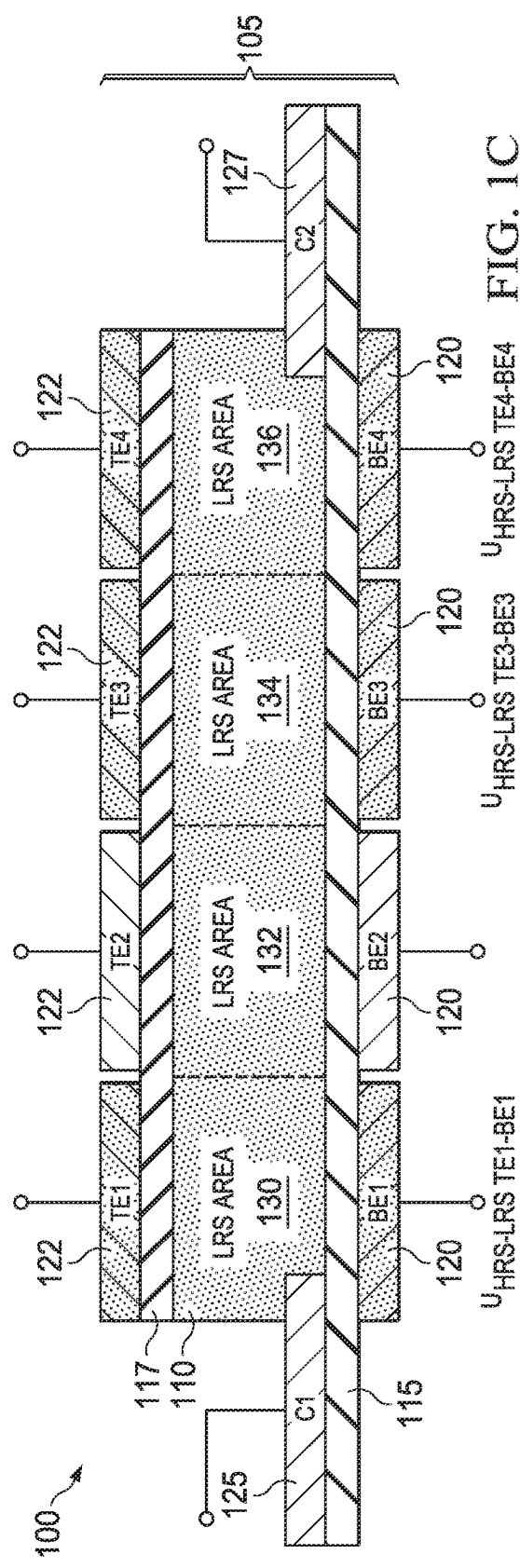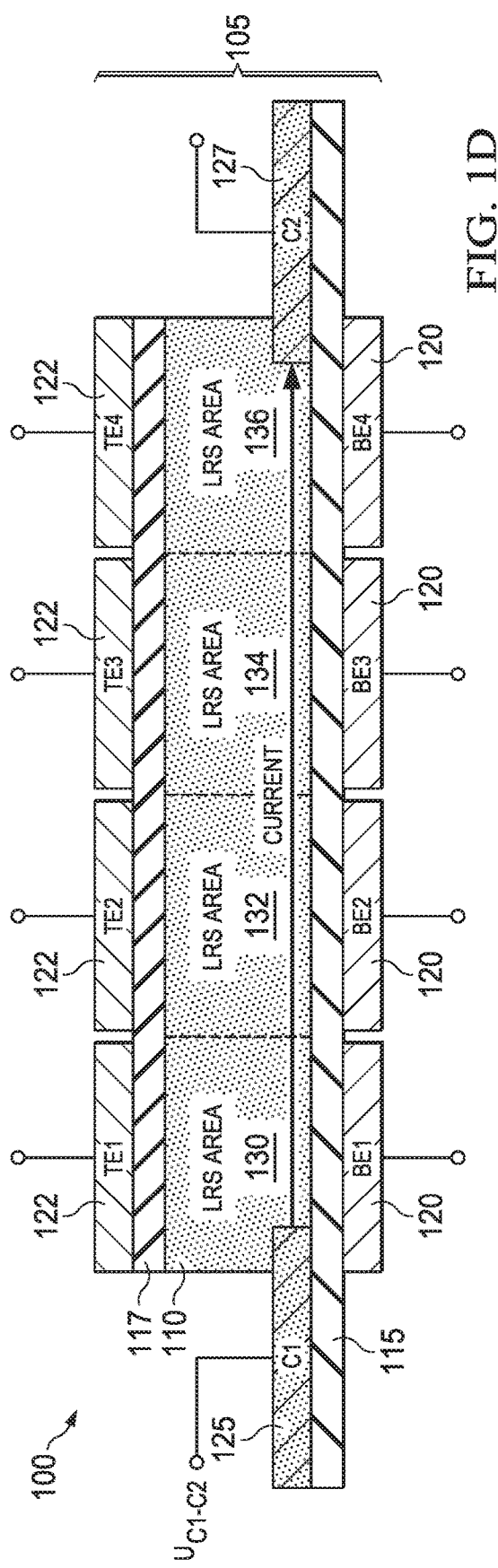

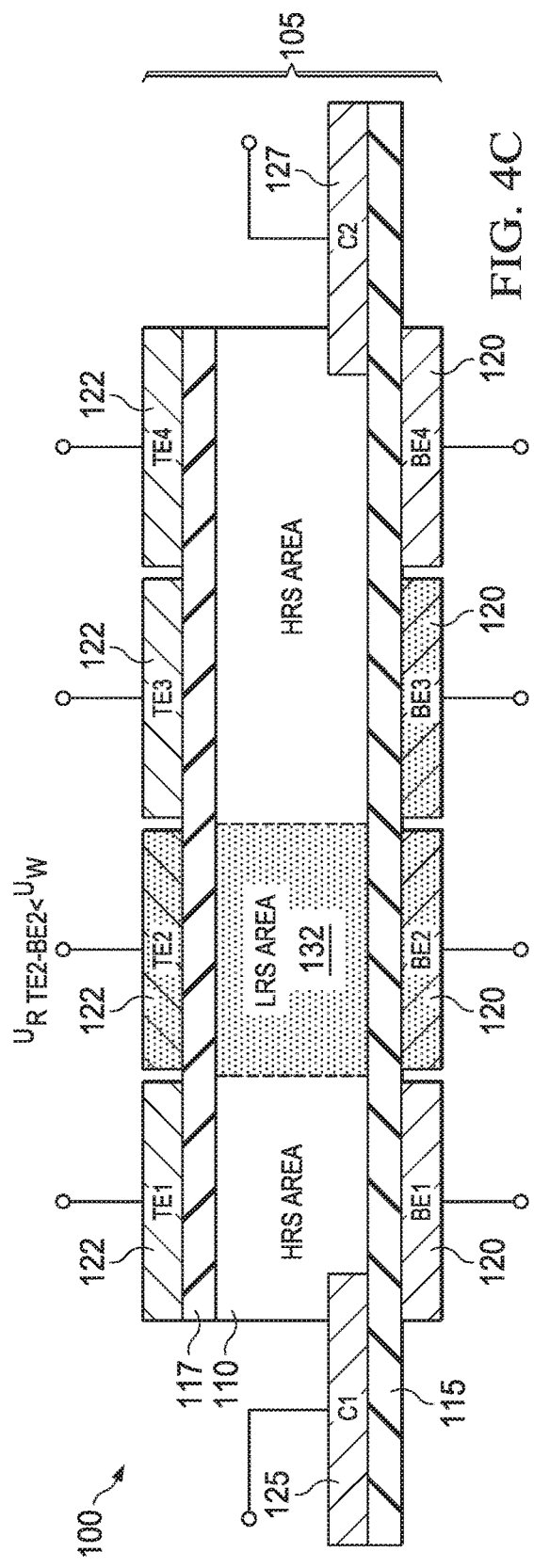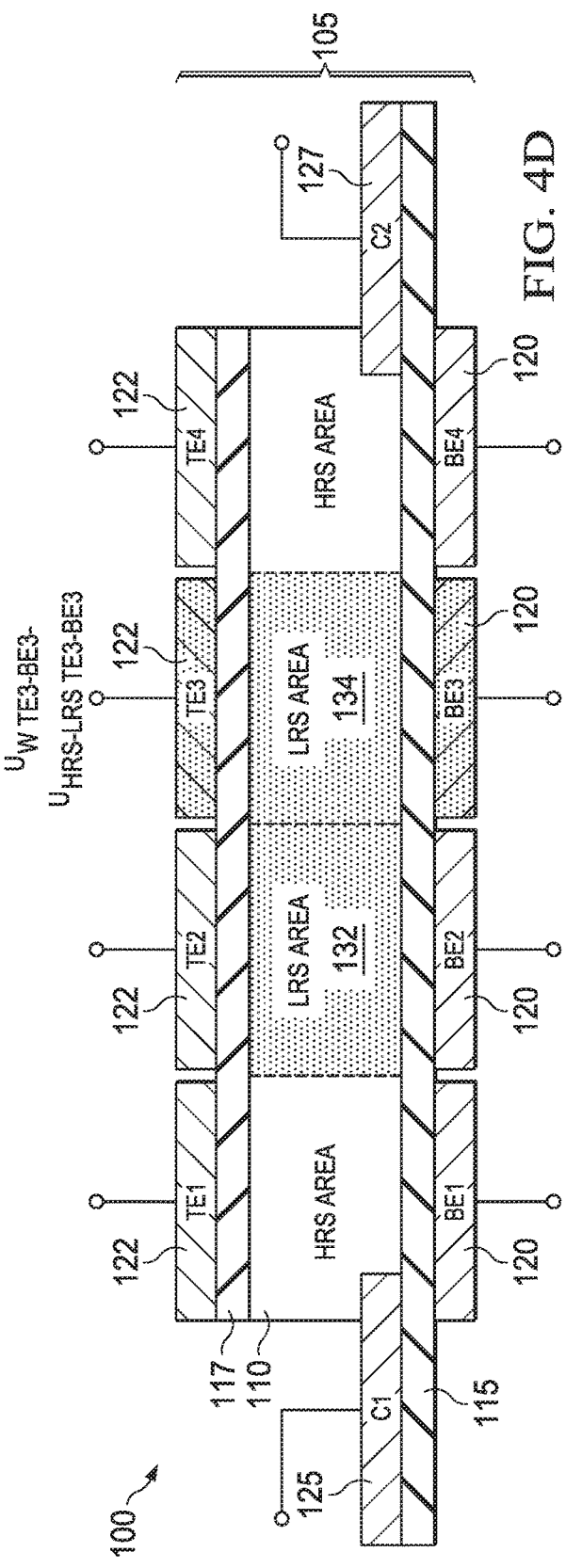

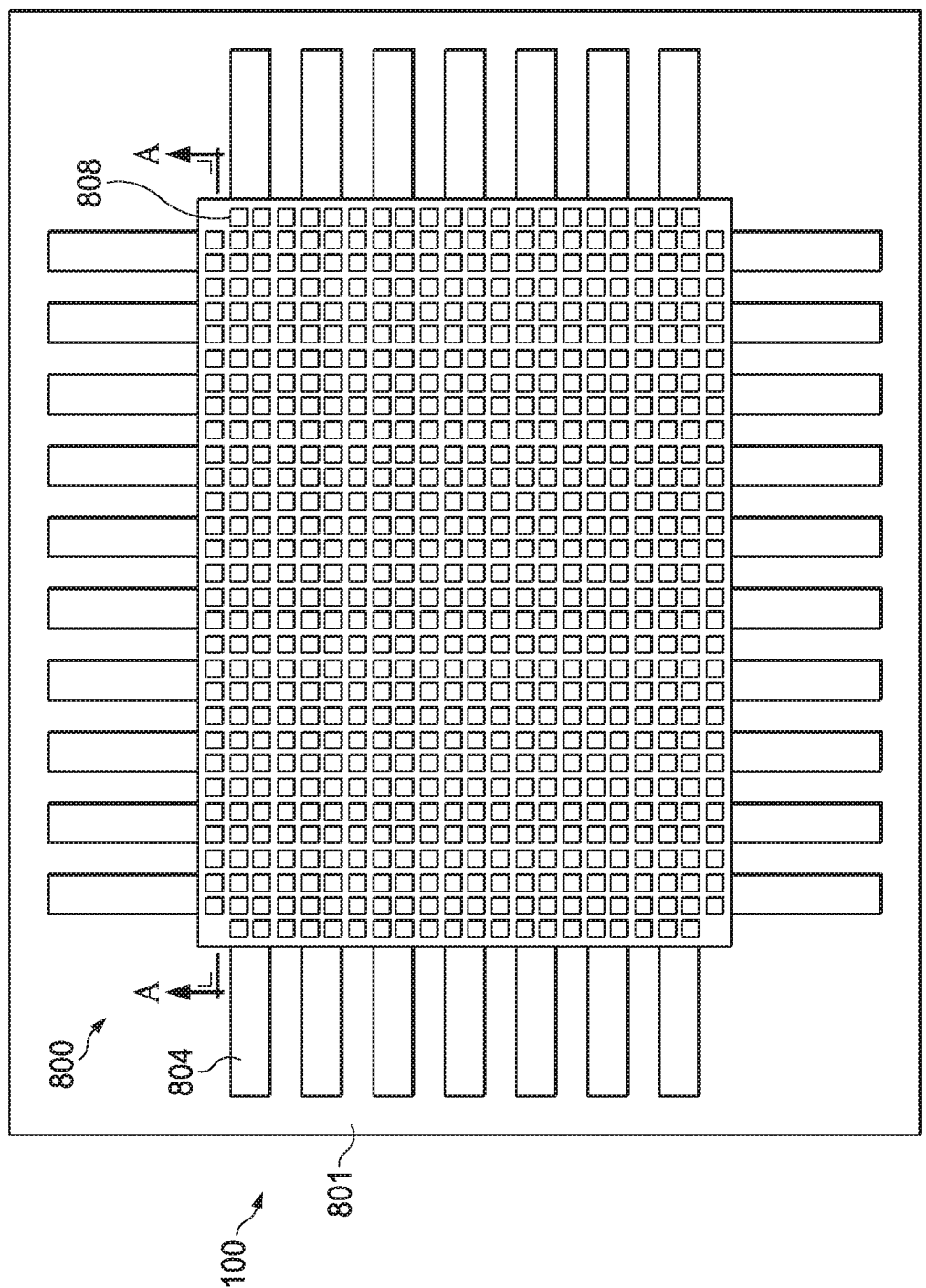

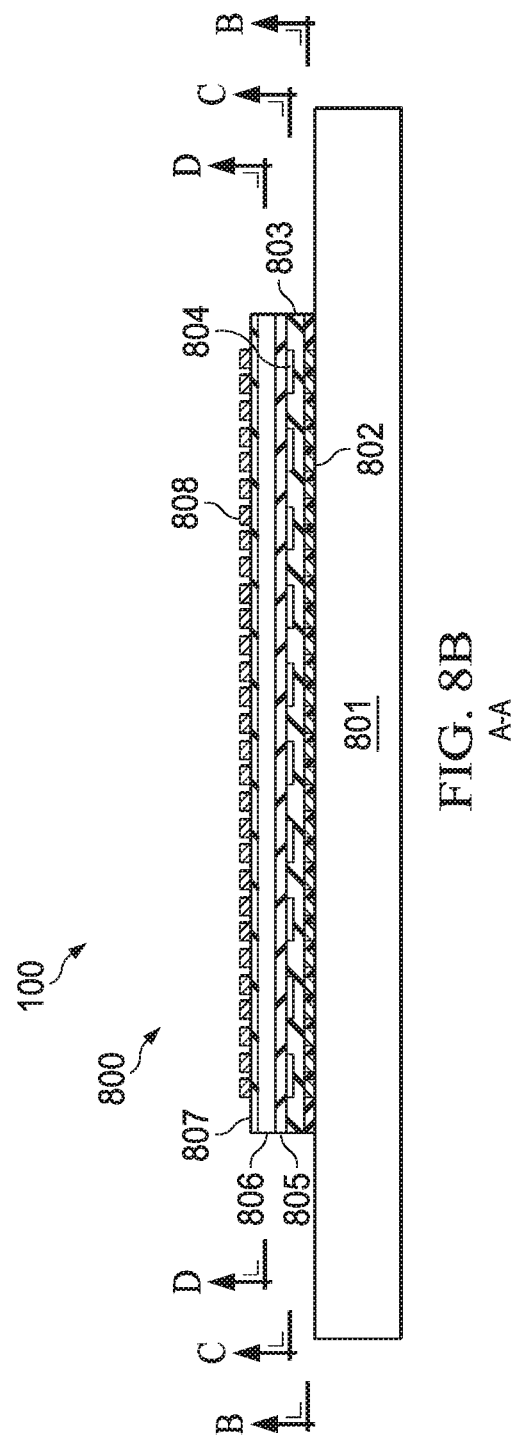

B-B

C-C

D-D

D-D

D-D

D-D

RECONFIGURABLE INTEGRATED CIRCUIT AND OPERATING PRINCIPLE

CROSS-REFERENCE TO RELATED APPLICATION

This application is the National Stage of, and therefore claims the benefit of, International Application No. PCT/US2017/065426 filed on Dec. 8, 2017, entitled "RECONFIGURABLE INTEGRATED CIRCUIT AND OPERATING PRINCIPLE," which was published in English under International Publication Number WO 2018/107101 on Jun. 14, 2018, and further claims the benefit of U.S. Provisional Application No. 62/432,345 filed on Dec. 9, 2016. The above applications are commonly assigned with this National Stage application and are incorporated herein by reference in their entirety.

TECHNICAL FIELD

The disclosure relates, in general, to electrical devices and, more specifically but not exclusively, to devices having post-manufactured reconfigurable integrated circuits and to methods of controlling such devices.

BACKGROUND

This section introduces aspects that may help facilitate a better understanding of the disclosure. Accordingly, the statements of this section are to be read in this light and are not to be understood as admissions about what is prior art or what is not prior art.

Typically, an integrated circuit (IC) is designed for a specific purpose and the circuit itself cannot be changed after manufacturing. That is, the circuitry of the IC is "fixed" and it is not possible to redefine, or reconfigure, the circuit layout after manufacturing. Even ICs including programmable logic devices (PLD), uncommitted logic arrays (ULA), programmable logic arrays (PLA), memristors, resistive random-access memory (ReRAM), and similar devices, are typically reconfigurable only within a logical framework laid down by developers during manufacturing. While such devices can change interconnections between logical elements within the logical framework, the logical framework itself cannot be changed post-manufacturing.

SUMMARY

One embodiment of the disclosure is an electrical device comprising a reconfigurable integrated circuit that includes paired top electrodes and bottom electrodes separated from each other by an active layer. The top electrodes are distributed in two or more rows parallel to a major planar surface of the active layer, each of the rows of top electrodes having different separation distances from the active layer along a dimension perpendicular to the major plane. The bottom electrodes are distributed in two or more rows parallel to the major plane of the active layer, each of the rows of bottom electrodes having different separation distances from the active layer along the dimension perpendicular to the major plane. A resistivity state of a portion of the active layer is changeable, independently of a resistivity of another portion of the active layer, by a voltage applied to the paired top and bottom electrodes corresponding to the portion of the active layer.

In some such embodiments, edges of adjacent ones of the bottom electrodes in the rows of bottom electrodes overlap in the dimension perpendicular to the major plane. In some such embodiments, edges of adjacent ones of the bottom electrodes in the rows of bottom electrodes overlap in the dimension perpendicular to the major plane. In some such embodiments, the top electrodes and bottom electrodes have a similar shape in planes parallel to their respective rows. In some such embodiments, the top electrodes and bottom electrodes can have an octagonal shape in planes parallel to their respective rows. Any such embodiments can further include a first insulating layer between the bottom electrodes and the active layer and a second insulating layer between the top electrodes and the active layer. In any such embodiments, the first row of top electrodes can be located on the second insulator layer and the second row of top electrodes can be located in the second insulator layer and the first row of bottom electrodes can be located in the first insulator layer and the second row of bottom electrodes can be located on the first insulator layer. In any such embodiments, at least some of the paired top and bottom electrodes can be separated by each other by a same distance. In any such embodiments, the paired top and bottom electrodes can include the top electrodes of the second row and the bottom electrodes of the second row, and, the top electrodes of the first row and the bottom electrodes of the first row. In any such embodiments, the paired top electrodes can form a two-dimensional array over the top major surface and the paired bottom electrodes can form a two-dimensional array over the bottom major surface of the active layer, respectively. Any such embodiments can further include contact electrodes on different portions of the active layer. In any such embodiments, each one of the top and bottom electrodes can be connected to a respective electrical lead. Any such embodiments can further include a voltage source connected to the paired top and bottom electrodes by electrical leads, the voltage source configured to apply the voltages to the paired top and bottom electrodes.

Another embodiment is another electrical device comprising a reconfigurable integrated circuit including a first set of paired top electrodes and bottom electrodes separated by a first active layer. The integrated circuit further includes a second set of paired top electrodes and bottom electrodes separated by a second active layer. One or more vias connect portions of the first active layer to portions of the second active layer. A resistivity state of a portion of the active layers is changeable independently from a resistivity state of another portion of the active layers by a voltage applied to a paired top and bottom electrodes corresponding to the portion of the active layer of the first set or the second set.

Any such embodiments can further include a first insulating layer between the bottom electrodes of the first set and the first active layer, a second insulating layer between the top electrodes of the first set and the first active layer, a third insulating layer between the bottom electrodes of the second set and the second active layer and a fourth insulating layer between the top electrodes of the second set and the second active layer. In any such embodiments, each of the top electrodes and bottom electrodes of the first set and the second set can be located in single rows. In any such embodiments, the bottom electrodes of the first set can be located on a first insulator layer, the top electrodes of the first set can be located on a second insulator layer, the bottom electrodes of the second set can be located on a third insulator layer and the top electrodes of the second set can be located on a fourth insulator layer. In any such embodiments, the paired top and bottom electrodes of the first set and the paired top and bottom electrodes of the second set can be separated from each other by a same distance. In any such embodiments, the top electrodes of the first set can form a two-dimensional array over the top major surface of the first active layer and the bottom electrodes of the first set can form a two-dimensional array over the bottom major surface of the first active layer and the top electrodes of the second sets can form a two-dimensional array over the top major surface of the second active layer and the bottom electrodes of the second set can form a two-dimensional array over the bottom major surface of the second active layer. Any such embodiments can further include contact electrodes on different portions of the at least one of the first active layer or the second active layer. In any such embodiments, each one of the top and bottom electrodes can be connected to a respective electrical lead. Any such embodiments can further include a voltage source connected to the paired top and bottom electrodes by electrical leads, the voltage source configured to apply the voltages to the paired top and bottom electrodes.

BRIEF DESCRIPTION OF THE DRAWINGS

The embodiments of the disclosure are best understood from the following detailed description, when read with the accompanying FIGURES. Some features in the figures may be described as, for example, "top," "bottom," "vertical" or "lateral" for convenience in referring to those features. Such descriptions do not limit the orientation of such features with respect to the natural horizon or gravity. Various features may not be drawn to scale and may be arbitrarily increased or reduced in size for clarity of discussion. Reference is now made to the following descriptions taken in conjunction with the accompanying drawings, in which:

FIG. 1A presents a cross-sectional view of an example electrical device that includes an embodiment of a reconfigurable integrated circuit of the present disclosure, with no voltage being applied between pairs of top and bottom electrodes (e.g., TE1 and BE1, TE2 and BE2, etc. . . . ) separated by an active film layer in a high resistance state (HRS area);

FIG. 1B presents the same view of the example electrical device as shown in FIG. 1A, after applying a voltage (e.g., $U_{HRS-LHS}$) between one pair of top and bottom electrodes (e.g., TE2 and BE2, respectively) to form a low resistance state in one area portion (LRS area) of the active film layer of the device;

FIG. 1C presents the same view of the example electrical device as shown in FIG. 1B, after applying a voltage (e.g., $U_{HRS-LHS}$) between multiple pairs of top and bottom pairs of electrodes (e.g., TE1 and BE1, TE3 and BE3, and TE4 and BE4) to form a low resistance state in multiple area portions (LRS area) of the active film layer of the device;

FIG. 1D presents the same view of the example electrical device as shown in FIG. 1C and further shows a current passing through the portions of the active film layer in the low resistance state from a first contact layer (C1) to a second contact layer (C2);

FIG. 2A' presents a semitransparent plan top view of the example electrical device depicted in FIG. 2A;

FIG. 4C presents the same view of the example electrical device as shown in FIG. 4B, with the resistance state of the cell being read, e.g., by using a lower voltage $U_{R\ TE2-BE2}$ to read the state of resistivity of the cell;

FIG. 4D presents the same view of the example electrical device as shown in FIG. 4C, after the low resistance state of the cell, is written to another cell, e.g., by applying a voltage, $U_{W\ TE3-BE3}$, between another pair of top and bottom electrodes separated by another area portion of the active film layer to form a same low resistance state in the other area portion (second LRS area) corresponding to the other cell;

FIG. 8A presents a plan top view of an example reconfigurable integrated circuit of the disclosure;

FIG. 8B presents a cross-section view of the example reconfigurable integrated circuit depicted in FIG. 8A along view line A-A shown in FIG. 8A;

In the Figures and text, similar or like reference symbols indicate elements with similar or the same functions and/or structures.

Figure 1E:
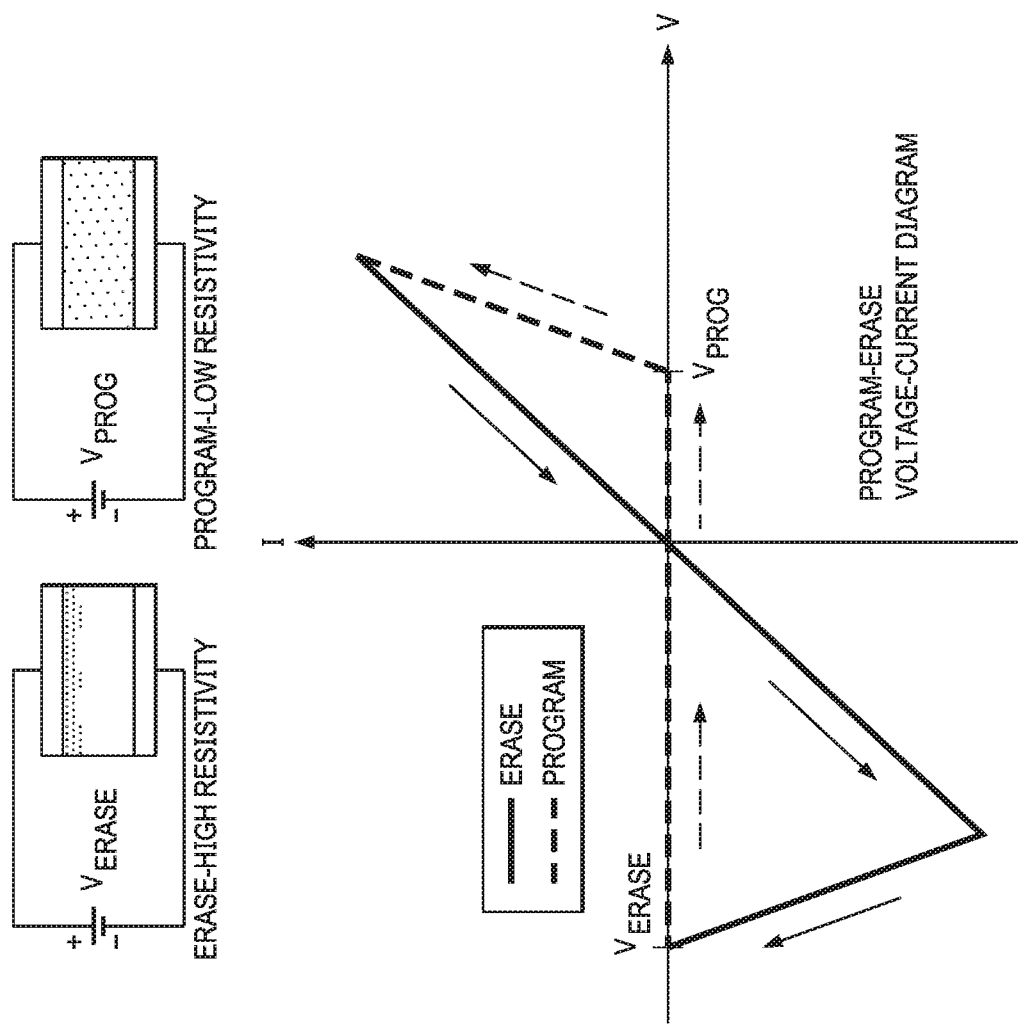
FIG. 1E presents a diagram to illustrate example programming and erase operations of an example single cell.

In the Figures, the relative dimensions of some features may be exaggerated to more clearly illustrate one or more of the structures or features therein.

Herein, various embodiments are described more fully by the Figures and the Detailed Description. Nevertheless, the disclosure may be embodied in various forms and are not limited to the embodiments described in the Figures and Detailed Description of Illustrative Embodiments.

DETAILED DESCRIPTION

The description and drawings merely illustrate the principles of the inventions. It will thus be appreciated that those skilled in the art will be able to devise various arrangements that, although not explicitly described or shown herein, embody the principles of the inventions and are included within its scope. Furthermore, all examples recited herein are principally intended expressly to be for pedagogical purposes to aid the reader in understanding the principles of the inventions and concepts contributed by the inventor(s) to furthering the art, and are to be construed as being without limitation to such specifically recited examples and conditions. Moreover, all statements herein reciting principles, aspects, and embodiments of the inventions, as well as specific examples thereof, are intended to encompass equivalents thereof. Additionally, the term, "or," as used herein, refers to a non-exclusive or, unless otherwise indicated. Also, the various embodiments described herein are not necessarily mutually exclusive, as some embodiments can be combined with one or more other embodiments to form new embodiments.

We disclose electrical devices which after manufacturing, can have its circuit fully or partially reconfigured, e.g., rapidly during normal operation or during a well-defined reconfiguration stage. We are unaware of current integrated circuit technologies having this capability. These reconfigurable electrical circuits enable the development of integrated circuits that are suitable for the development of brain-like devices, intelligent systems, and multi-purpose chips. Embodiments of reconfigurable integrated circuit technology as disclose herein can be rapidly programmable and as such provide broad design flexibility.

Embodiments of the disclosed reconfigurable integrated circuit can use an active layer (e.g., thin film layers comprising memristive materials or phase-change meta-materials) having two or more states of resistivity, that can be changed by applying a given one of a set of different voltage levels between a respective pair of top and bottom electrodes. Maintaining the state of resistivity is non-volatile. For instances, a particular voltage only needs to be applied for a limited duration, after which the portion of the active layer that is associated with the particular electrodes retains its changed resistivity state. Each pair of electrodes controls the resistivity of a defined area portions, or cells, of the active layer. In some embodiments one-, two- or three-dimensional arrays of pairs of electrodes are used to independently set the cells to certain resistivity states. Setting neighboring cells to a low resistance state can establish conductivity across these neighboring cells. Voltage applied across connected cells that are programmed to be in a low-resistance state allows a laterally or vertically connected set of low-resistance areas to carry signals. This effect can also be used for controlling electrical properties in a channel between gates in transistor structures. As such, persistent structures can be used to create connections, transistors, memory cells or other kinds of circuitry. The circuit layout structure of the reconfigurable integrated circuit can be erased by changing the resistivity of the cells having a low resistance state to a high resistance state by applying a certain voltage between corresponding pairs of top and bottom electrodes. Reconfiguration of the integrated circuit layout can occur by erasing part of the IC layout, and creating new elements and interconnections in a different IC layout. In some embodiments, as disclosed herein, it is possible to create any number of different integrated circuit lay-outs and then transform layout depending on relevance to the real-time tasks.

Embodiments of the disclosed reconfigurable integrated circuit offer the ability to: 1) manufacture an integrated circuit device that comprises one or more active film layers; 2) form an arbitrary electrical circuit layout by using an array of top and bottom electrodes to adjust the resistivity of given area portions of the active layer; 3) "erase" all or part of the integrated circuit layout, and 4) replace all or part of the integrated circuit layout with another arbitrary electrical circuit layout. As such, embodiments of the integrated circuit allow full reconfigurability and thus flexibility of functionality.

Embodiments of the disclosed reconfigurable integrated circuit are thought to provide several advantages: 1) Run-time reconfiguration. 2) Possibility of changing not only interconnections between elements, but also the structure, type, and number of logical elements. 3) The entire area of the active layer or layers can be used when forming the elements. This is unlike some traditional approaches related to using a number of "fixed" individual elements that are connected by configurable "fixed" interconnection network to form a given ("reconfigurable") integrated circuit. 4) Circuit elements can be placed anywhere in the active film layer, because, e.g., the circuit element does not require having special doped areas. 5) Device embodiments make it possible to create and reconfigure many different kinds of integrated circuit layouts as part of a same integrated circuit device.

Various aspects of the disclosed reconfigurable integrated circuit and its operation are illustrated in various example embodiments disclosed herein. The operating principle of the disclosed electrical devices is related to the use of cells (like pixels) in a uniform layer (e.g., thin film layer or layers) of an active material having electrical properties (e.g., different resistivity states) depending on the voltage between the top and bottom electrodes. By applying a voltage (e.g., $U_{HRS\text{-}LRS}$) between a pair of top and bottom electrodes associated with one cell corresponding to an area portion of the active film layer or layers, the local resistivity of the cell can be switched between a high-resistance state (HRS) and a low resistance state (LRS).

Aspects of the structure and operation of an embodiment the electrical device having a reconfigurable integrated circuit are illustrated in FIGS. 1A-1D.

FIG. 1A presents a cross-sectional view of an example electrical device 100 that includes an embodiment of a reconfigurable integrated circuit 105 of the present disclosure. FIG. 1A shows the reconfigurable integrated circuit 105 with no voltage being applied between pairs of top and bottom electrodes (e.g., TE1 and BE1, TE2 and BE2, etc. . . . ) separated by an active layer in a high resistance state (HRS area).

As illustrated, an active layer (e.g., layer 110) is positioned between a bottom and a top insulator layer (e.g., insulating layers 115, 117), and pairs of bottom and top electrodes (e.g., bottom electrode 120 and top electrode 122) are located on the respective insulating layers. Electrical contacts (e.g., contacts, C1, C2, 125, 127) are located on at least one of the insulating layers (e.g., bottom insulator layer 115) and touching different portions of the active layer.

FIG. 1A shows the reconfigurable integrated circuit 105 with four configured cells (e.g., cells 130, 132, 134, 136) and two contact points 125, 127. The cells can be used as elementary areas for configuring or reconfiguring circuitry. The resistivity of the film area associated with a cell can be modified by applying a given voltage between a pair of top and bottom electrodes associated with that cell. For example, by applying voltage $U_{LRS\text{-}HRS}$ between a pair of top and bottom electrodes associated with one cell, the corresponding area can be switched from a low resistive state (LRS) to a high resistive state (HRS), thus erasing a conductive channel that the cell is a part of. For some embodiments, a cell's resistive state can be non-volatile, and as such, the resistive state is maintained during normal operation and after power resets.

FIG. 1B shows the example electrical device after applying a voltage (e.g., $U_{HRS\text{-}LHS}$) between one pair of top and bottom electrodes 122, 120 (e.g., TE2 and BE2, respectively) to form a low resistance state in one area portion (e.g., LRS area corresponding to cell 132) of the active film layer 110 of the device 100, while other areas (e.g., other cells) are not affected and remain in the high-resistivity state.

FIG. 1C shows the example electrical device 100 after applying a voltage (e.g., $U_{HRS\text{-}LHS}$) between multiple pairs of top and bottom pairs of electrodes (e.g., TE1 and BE1, TE2 and BE2, TE3 and BE3, and TE4 and BE4) to form a low resistance state in multiple area portions (multiple LRS areas corresponding to all four cells 130 . . . 134)) of the active film layer 110 of the device 100. As a result, a connection between the two contacts 125, 127 of the circuit can be established via the four cells configured in the LRS. No voltage needs to be applied once the low resistance state has been formed.

For instance, FIG. 1D presents the same view of the example electrical device as shown in FIG. 1C and shows a current passing through the portions of the active film layer 110 in the low resistance state from a first contact layer 125 (C1) to a second contact layer 127 (C2). One skilled in the pertinent arts would understand that embodiments of the contact layer are electrical contacts and may be metallic connections, used to apply input signals or from which to observe output signals.

FIG. 1E presents a diagram to illustrate example programming and erase operations of an example single cell, e.g., a redox-based memristive effect in a metal oxide film. The resistivity of a cell can be changed by applying different voltages between the top and bottom electrodes that are associated with the cell. By applying $V_{prog}$, oxygen vacancies, represented in the figure as black dots, move inside the redox-based memristive material, thus switching the cell to a low resistivity state, e.g., in about 50 ns. If a negative voltage $V_{erase}$ is applied, the oxygen vacancies will move to the top electrode, as such switching the cell to a high resistivity state. A cell retains its resistivity state when no voltage is applied.

Figure 2A:
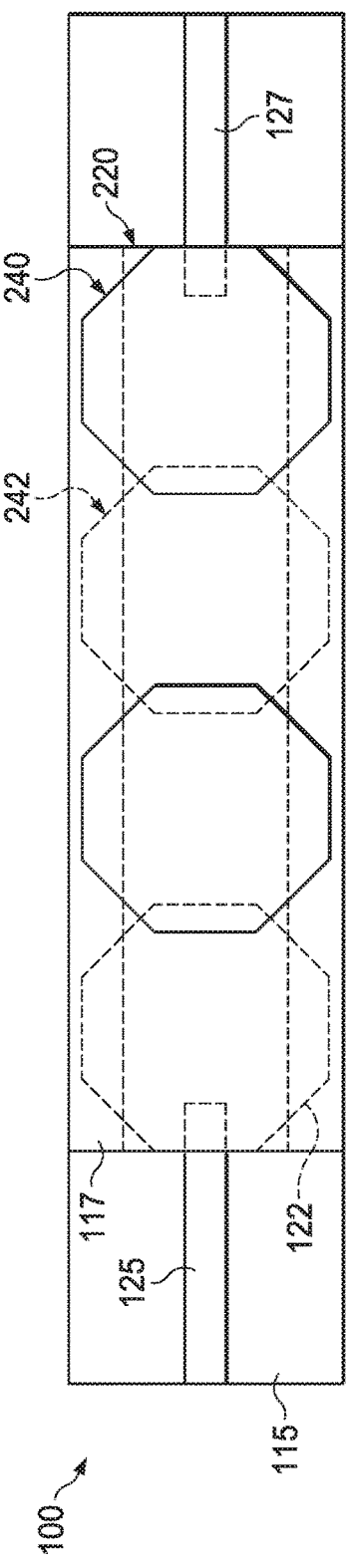
FIG. 2A presents a cross-sectional view of another example electrical device that includes an embodiment of a reconfigurable integrated circuit of the present disclosure, with no voltage applied between overlapping adjacent pairs of top and bottom electrodes separated by an active film layer in a high resistance state (HRS area)
Figure 2A:
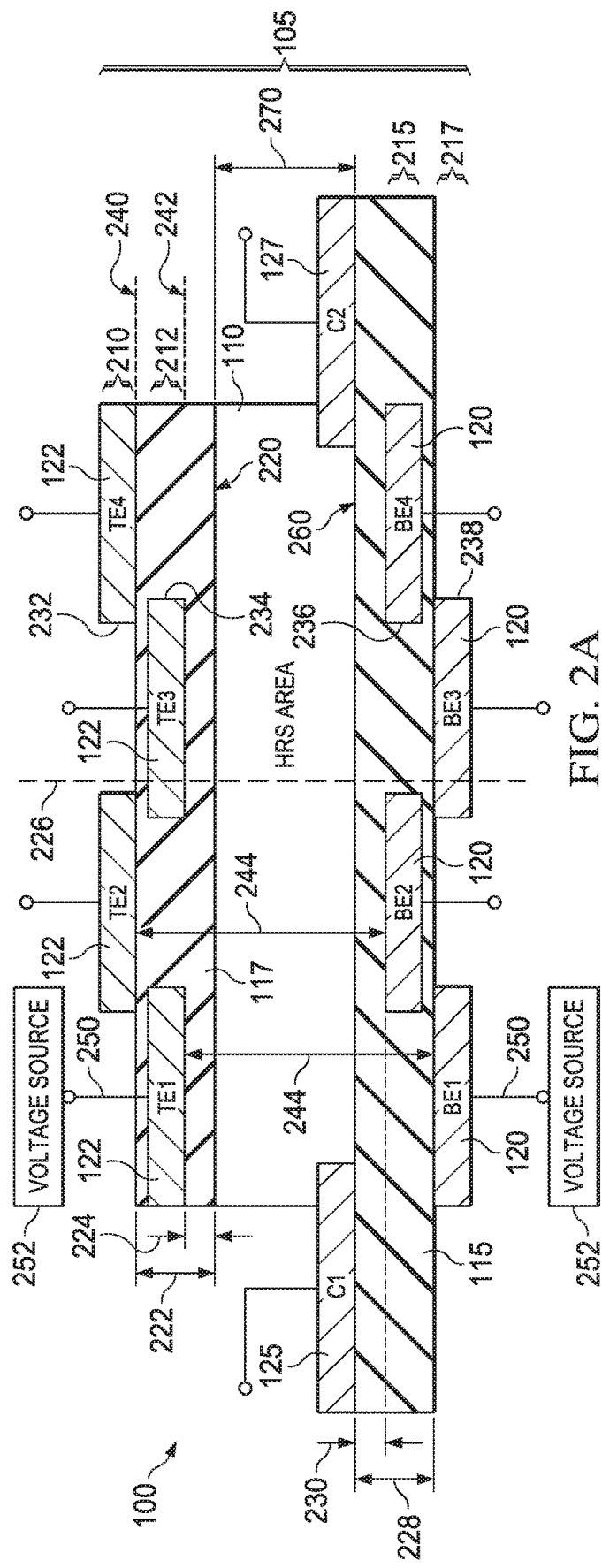
Figure 2B:
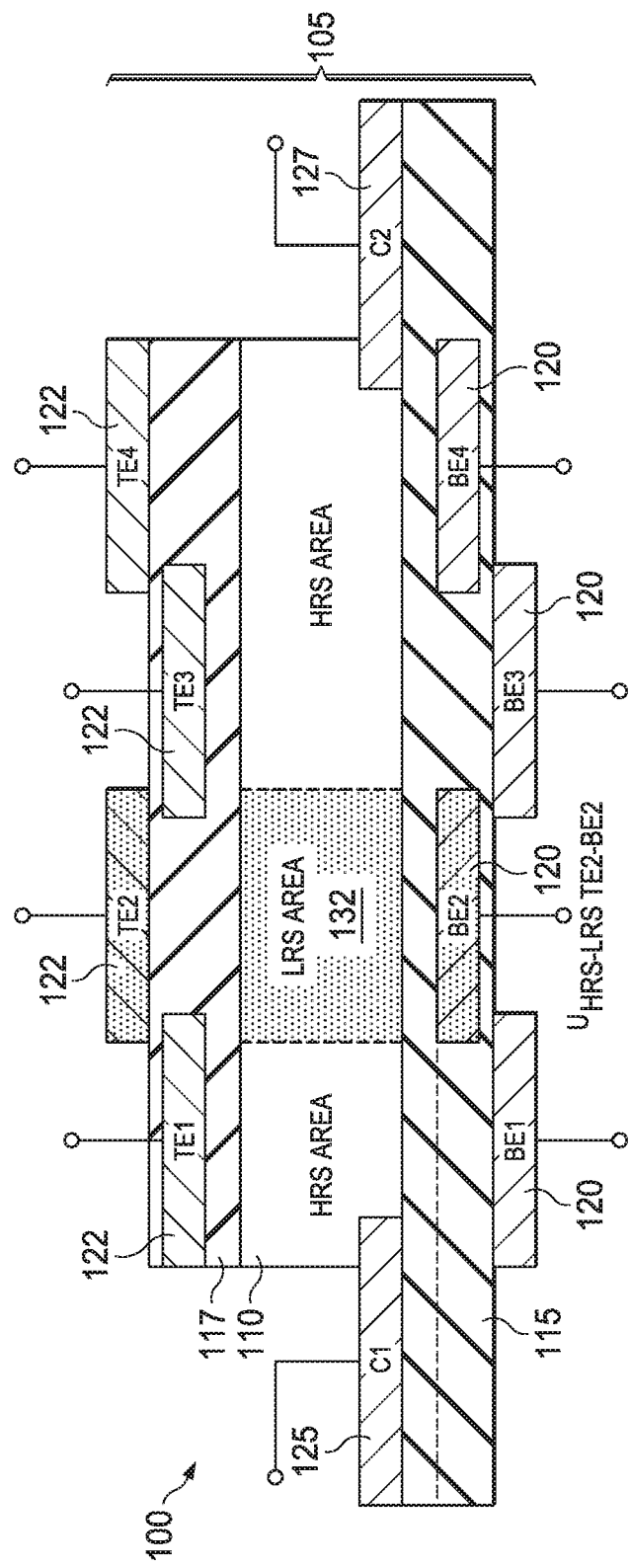
FIG. 2B presents the same view of the example electrical device as shown in FIG. 2A, after applying a voltage (e.g., $U_{HRS-LHS}$) between one pair of top and bottom electrodes (e.g., TE2 and BE2, respectively) to form a low resistance state in one area portion (LRS area) of the active film layer of the device.

FIG. 2A presents a cross-sectional view of another example electrical device 100 (e.g., a cross-sectional view through the middle of the active layer) that includes an embodiment of a reconfigurable integrated circuit 105, with no voltage applied, between overlapping adjacent pairs of top and bottom electrodes 122, 120 (e.g., pairs TE1-BE1, TE2-BE2, . . . ) separated from each other by an active film layer 110 in a high resistance state (HRS area). As illustrated, the overlapping top and bottom electrodes 122, 120 are enlarged (e.g., compared to the electrodes shown in FIG. 1A) and placed in two different vertically separated layers (e.g., top electrodes distributed in rows 210, 212 and bottom electrodes distributed in rows 215, 217) that are parallel to a major plane (e.g., major planar surface 220) of the active layer.

As illustrated in FIG. 2A, each of the rows 210, 212 of top electrodes 117 have different separation distances (e.g., distances 222, 224) from the active layer 110 along a dimension (e.g. dimension 226) perpendicular to the major plane 220. Likewise, each of the rows 215, 217 of bottom electrodes 115 have different separation distances (e.g., distances 228, 230) from the active layer 110 along a dimension 226 perpendicular to the major plane 220. Edges of adjacent ones of the top electrodes (e.g., edges 232, 234) in the rows of top electrodes overlap in the dimension perpendicular to the major plane. Edges of adjacent ones of the bottom electrodes (e.g., edges 236, 238) in the rows of bottom electrodes overlap in the dimension perpendicular to the major plane.

As illustrated in the plan top view shown in FIG. 2A, in some embodiments, the top and bottom electrodes 122, 120 can have an octagonal shape, e.g., to facilitate fitting the electrodes in the two or more rows. For instance as shown in FIGS. 2A and 2A', the top electrodes 122 has an octagonal shape in planes 240, 242 parallel to their respective different rows 210, 212. Other embodiments of the electrodes 120, 122 can have other shapes, e.g., circular or hexagonal shapes, to form different areas of vertical overlap between adjacent pairs of top electrodes or between adjacent pairs of bottom electrodes in the different rows (e.g., between electrodes 120 in rows 210, 212, and/or, between electrodes 120 in rows 215, 217.

An advantage of the embodiments such as show in FIGS. 2A and 2A' is that the cell areas in the horizontal and vertical direction can have a slight overlap, thus facilitating better control, and provide a greater homogeneity, of the resistivity of the (horizontal or vertical) boundary area of adjacent cells, e.g., by providing a more uniform electrical field density through the cells. In some such embodiments, relative to an embodiment of non-overlapping electrodes such as shown in FIGS. 1A-1D, a lower voltage between pairs of top and bottom electrodes may be needed for changing the resistivity of the respective cells. In still other embodiments, there may be a common bottom (or top) electrode associate with a group of cells.

As illustrated in FIG. 2A, in some embodiments, a first insulating layer 115 can be located between the bottom electrodes 120 and the active layer 110 and a second insulating layer 117 can be located between the top electrodes 122 and the active layer 110. In some embodiments, the first row 210 of top electrodes 122 are located on the second insulator layer 117 and the second row 212 of top electrodes 122 are located in the second insulator layer 117, and, the first row 215 of bottom electrodes 120 are located in the first insulator layer 115 and the second row 217 of bottom electrodes 120 are located on the first insulator layer 115.

As illustrated in FIG. 2A, in some embodiments, to facilitate forming same uniform electric fields in different portions of the active layer, the paired top and bottom electrodes (e.g., paired electrodes TE1 and BE1, and, TE2 and BE2) are separated from each other by a same distance 244. For instance, for some such embodiments, the paired top and bottom electrodes include the top electrodes 122 of the second row 212 (e.g., TE1 and TE3) and the bottom electrodes 120 (e.g., BE1 and BE3) of the second row 217, and, the top electrodes 122 (e.g., TE2 and TE4) of the first row 210 and the bottom electrodes 120 (e.g., BE2 and BE4) of the first row 215. However, in other embodiments, the distance could vary as long as other adjustments are being made in the programming cycle.

As illustrated in FIG. 2A, in some embodiments, each one of the bottom and top electrodes 120, 122 can be connected to separate leads 250 (e.g., wire leads). In some such embodiments the device 100 can include a voltage source 252 connected to the bottom and top electrodes 120, 122 by the leads 250. In some embodiments, the voltage source (e.g., a programmable voltage pulse generator) can be configured to apply the voltages to the paired top and bottom electrodes (e.g., TE1 and BE1).

Figure 2C:
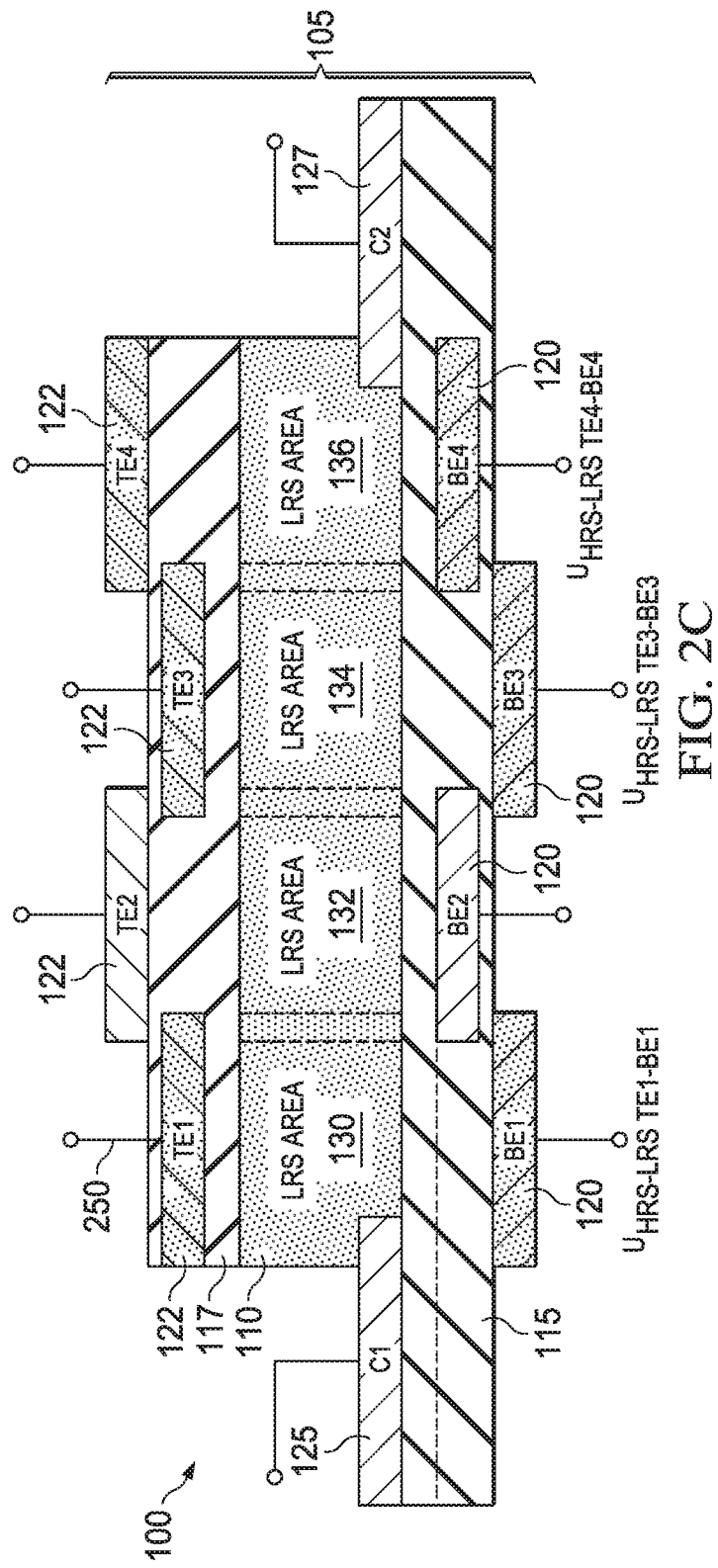
FIG. 2C presents the same view of the example electrical device as shown in FIG. 2B, after applying a voltage (e.g., $U_{HRS-LHS}$) between multiple pairs of top and bottom pairs of electrodes (e.g., TE1 and BE1, TE3 and BE3, and TE4 and BE4,) to form a low resistance state in multiple area portions (LRS area) of the active film layer of the device.
Figure 2D:
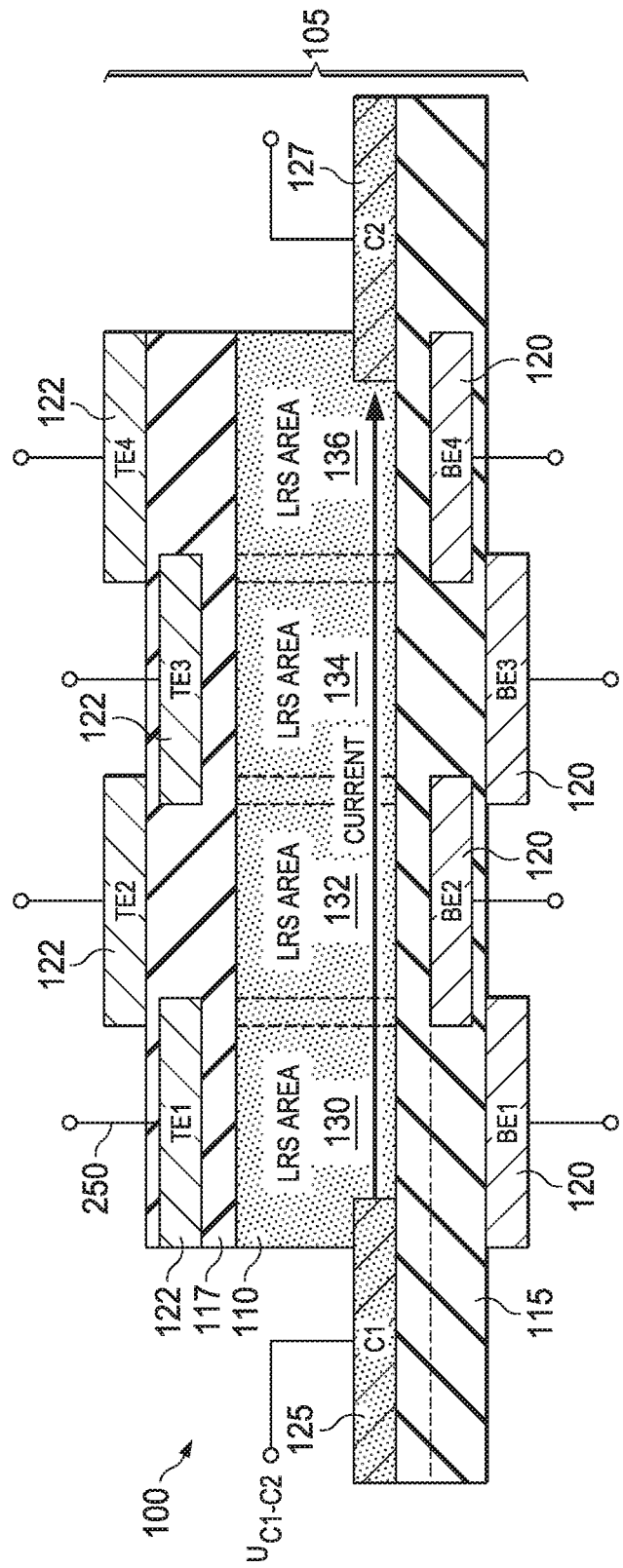
FIG. 2D presents the same view of the example electrical device as shown in FIG. 2C, and further shows a current passing through the area portions of the active film layer in the low resistance state from a first contact layer (C1) to a second contact layer (C2)

Analogous to FIGS. 1B-1D, FIG. 2B shows the example electrical device after applying a voltage (e.g., $U_{HRS-LHS}$) between one pair of top and bottom electrodes 122, 120 (e.g., TE2 and BE2, respectively) to form a low resistance state in one area portion (e.g., LRS area corresponding to cell 132) of the active film layer of the device, FIG. 2C shows the example electrical device after applying a voltage (e.g., $U_{HRS-LHS}$) between multiple pairs of top and bottom pairs of electrodes 122, 120 (e.g., TE1 and BE1, TE2 and BE2, TE3 and BE3, and TE4 and BE4,) to form a low resistance state in multiple area portions (LRS areas corresponding to cells 130 . . . 134) of the active film layer 110 of the device 100, and, FIG. 2D show the example electrical device with a current ("Current") passing through the area portions of the active film layer 110 in the low resistance state from a first contact layer 125 (C1) to a 127 second contact layer (C2).

Figure 3B:
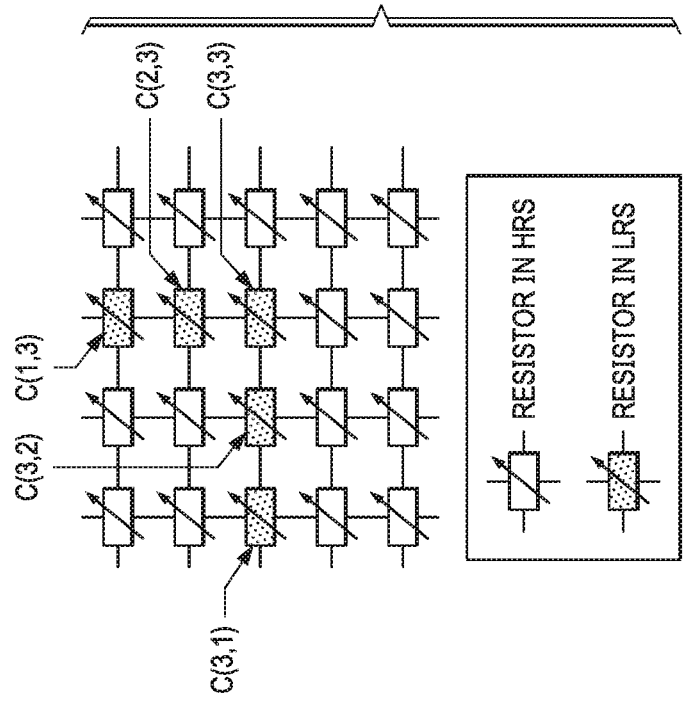
FIGS. 3A-B present plan views of a schematic equivalent electric circuit of a two-dimensional array of cells corresponding to different portions of an active film layer that are individually switchable between low and high resistance states (LHS and HRS, respectively) by applying voltages to the top and bottom electrodes adjacent to selected different portions (e.g., cells at coordinates C(row, column)) of the film layer, as follows A) no voltages applied, B) voltages applied to cells C(3,1), C(3,2), C(3,3), C(2,3), C(1,3)
Figure 3A:
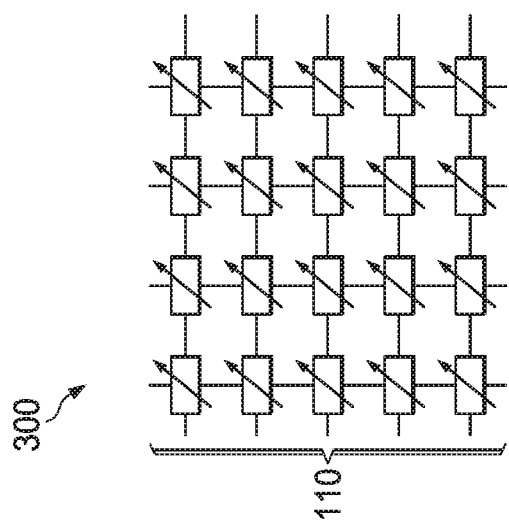
Figure 3C:
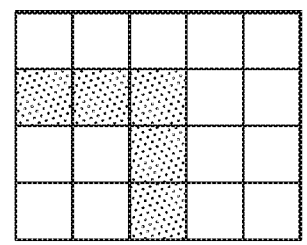
FIG. 3C present a high-level schematic plan view of the equivalent electric circuit two-dimensional array of cells in low and high resistance states as depicted in FIG. 3B.

FIGS. 3A-B present plan views of a schematic equivalent electric two-dimensional array of cells 300, corresponding to different portions of an active film layer 110, that are individually switchable between low (LHS) and high (HRS) resistance states by applying voltages to the top and bottom electrodes (e.g., rectilinear shaped electrodes) adjacent to selected different portions (e.g., cells at coordinates C(row, column)) of the film layer 110, as follows A) no voltages applied, B) voltages applied to cells C(3,1), C(3,2), C(3,3), C(2,3), C(1,3). FIG. 3C present a high-level schematic plan view of the equivalent electric two-dimensional array of cells in low (LHS) and high (HRS) resistance states as depicted in FIG. 3B.

For instance, in devices 100 analogous to that depicted in FIGS. 2A-2A' in some embodiments, the paired top electrodes 122 and bottom electrodes 120 form two-dimensional arrays over the top major surface (e.g., planar surface 220) and bottom major surface (e.g., planar surface 260) of the active layer 110, respectively.

FIG. 3A provides an illustrative example of a 4×5-array of cells where each cell can be modeled as a variable resistor with north, south, east and west connectors. As illustrated in FIG. 3B, applying a voltage to the top and bottom electrodes of cells C(3,1), C(3,2), C(3,3), C(2,3), C(1,3), can form a low-resistance path, e.g., to establish an electrically conductive. In view of this example one skilled in the pertinent art would understand how changing the resistivity of various cell from HRS to LRS it would be possible to form any number of different integrated circuit layouts.

The schematic electrical equivalents shown in FIGS. 3A-3C use variable resistors as representations of the cells 300 (e.g., having two or more resistive states). Although the cells are represent in this scheme as squares based on the present disclosure one skilled in pertinent art would understand how the shape of the top and bottom electrodes for each of the cells could have different shapes (e.g., octagonal or other shapes), with or without vertical overlap, e.g., as already discussed in the context of FIG. 2A'. Additionally, the cells 300 are represented as having up to four electrical connections to horizontally adjacent cells. Based on the present disclosure one skilled in the pertinent arts would appreciate how vertical electrical connections could be present for vertically adjacent cells in a three-dimensional array of the cells 300.

The active film layer can be made of materials whose resistivity can be changed from a high to low or low to high resistivity by applying a voltage potential across a layer of such a material. In some embodiments, the active film layer comprises, and in some embodiments consists of, a memristive material (e.g., a memory resistor). In some embodiments, the active film layer comprises, and in some embodiments consists of, a meta-material. In some embodiments, the active film layer comprises, and in some embodiments consists essentially of, memristive material or meta-material, where the layer may contain trace amounts (e.g., less than 1, 0.1 or 0.01 wt %) of non-memristive materials or non-meta-materials that do not affect the ability of the material's resistivity to be changed by applying the voltage potential as described herein.

Based upon the present disclosure one skilled in the pertinent arts would understand that the material to be used as the active film layer should have the chemical composition, structural form, and electrical properties for effective implementation of resistive switching, including consideration of the peak ratio of resistances between low-resistance and high-resistance states, lowest resistance values in the low-resistance state, low switching time, and length of a particular resistive state storage time.

Non-limiting examples of suitable materials which possess a memristive effect include metal oxides such as $MgO_x$, $AlO_x$, $SiO_x$, $TiO_x$, $CrO_x$, $MnO_x$, $FeO_x$, $CoO_x$, $NiO_x$, $CuO_x$, $ZnO_x$, $GaO_x$, $GeO_x$, $ZrO_x$, $NbO_x$, $MoO_x$, $HfO_x$, $TaO_x$, $WO_x$, $CeO_x$, $GdO_x$, $YbO_x$, $LuO_x$, $LaAlO_3$, $SrTiO_3$, $BaTiO_3$, Lanthanum Calcium Manganese Oxide (LCMO), Lanthanum strontium manganite (LSMO), Praseodymium Calcium Manganese Oxide (PCMO), $BiFeO_3$, etc. . . . ; chalcogenides such as $Cu_2S$, $GeS_x$, $Ag_2S$, $Ge_xSe_y$, etc. . . . ; Nitrides such as AlN, SiN, etc. . . . ; or others such as a-C, graphene oxide, a-Si, AgI, etc . . . , familiar to those skilled in the pertinent art. Non-limiting examples of suitable phase-change meta-materials include $MoO_3$, $V_2O_5$, GeTe, $Sb_2Te$, or other materials with the ability to undergo a phase transition between different resistive states under the influence of an electric field.

Embodiments of the active layer can include single-crystalline, poly-crystalline, nano-crystalline, or amorphous structural forms of such materials having a resistive switching effect such as disclosed herein.

In some embodiments, the active layer (e.g., layer 110 in FIG. 2A) can include different material layers each having different states of resistivity for a given applied voltage, e.g., to facilitate implementation of not Boolean logic elements as part of the reconfigurable IC.

In some embodiments, to facilitate forming uniform resistivity states using low applied voltages, the active film layer can have a thickness (e.g., thickness 270 in FIG. 2A) in a range from 10 to 1000 nanometers).

In some embodiments, the voltage applied between top and bottom electrodes (e.g., voltage applied to electrodes TE2 and BE2 in FIG. 2B) to switch a portion of the active film layer from HRS to LRS (e.g., cell 132 in FIG. 2B) can be a voltage in a range from 1 to 10000 mV. In some such embodiments, the voltage is applied for a time period in a range from 0.01 ns to 10000 ns.

In some embodiments, the HRS of the active film layer has a resistivity (e.g., Ohm cm) that can be at least 10 times greater and in some embodiments at least about 100 times greater than a resistivity of the LRS of the active film layer.

One skilled in the pertinent arts would be familiar with conventional materials and techniques used in the semiconductor industry to deposit and pattern, e.g., using physical or vapor deposition and photolithography procedures, respectively, the various structural elements of the reconfigurable IC. Non-limiting examples of the materials used to form the top and bottom electrodes and contacts (e.g., electrodes 120, 122 and contacts 125, 127 in FIG. 2A) include silver, gold, copper, aluminum or multilayered combinations thereof. Non-limiting examples of materials used to form the insulating layers (e.g., insulating layers 115, 117 in FIG. 2A) include silicon dioxide. In some embodiments, the insulating layers can be made of the same material while in other embodiments different insulating layers can be made of different materials.

In some embodiments of the device, arrays (e.g., 1- 2- or 3-dimensional arrays) of cell structures can be used to write, read, store and erase a binary digit (e.g., a bit) of information. This is illustrated for a four-cell configuration shown in FIGS. 4A-4E.

Figure 4A:
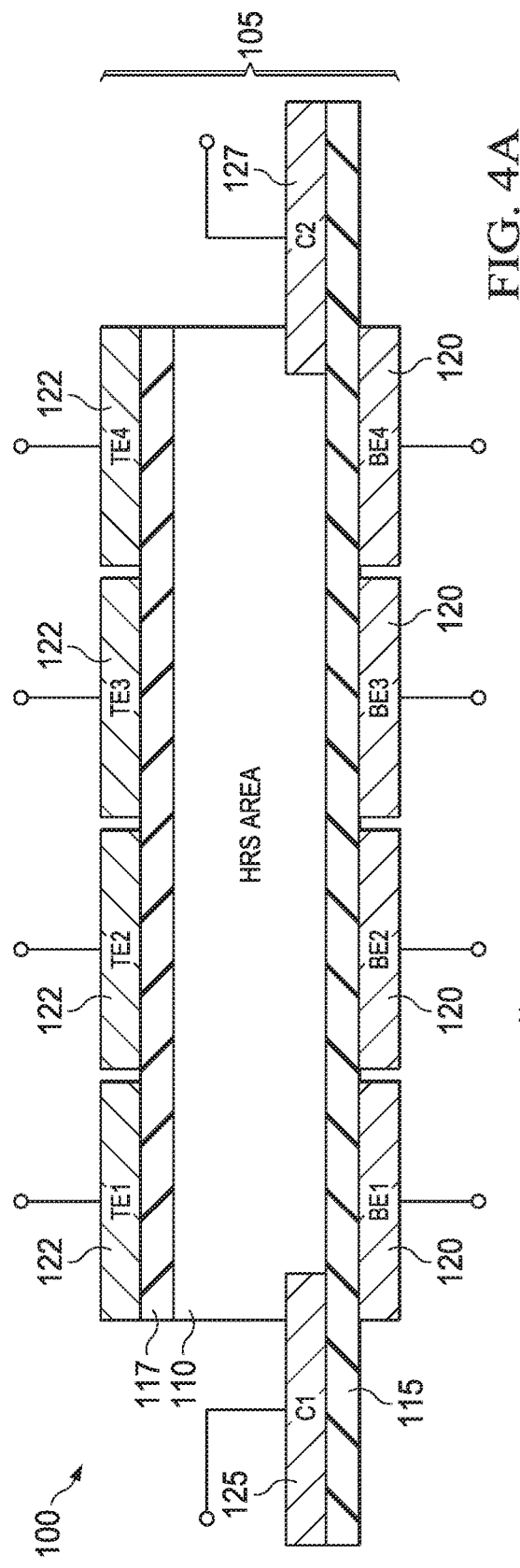
FIG. 4A presents a cross-sectional view of an example electrical device analogous to that shown in FIG. 1A, with no voltage applied between pairs of top and bottom electrodes separated by an active film layer in a high resistance state (HRS area)

FIG. 4A presents a cross-sectional view of an example electrical device 100 analogous to that shown in FIG. 1A, with no voltage applied between pairs of top and bottom electrodes 122, 120 separated by an active film layer 110 in a high resistance state (HRS area).

Figure 4B:
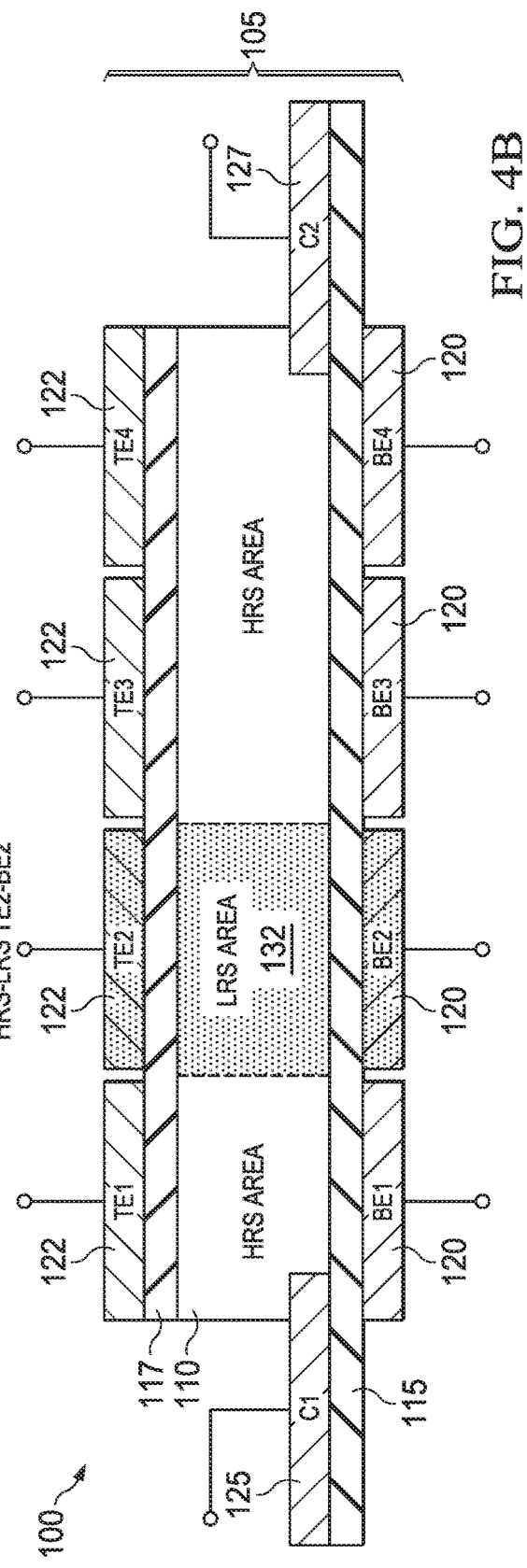
FIG. 4B presents the same view of the example electrical device as shown in FIG. 4A, after a voltage, $U_{W\ TE2-BE2}$, is applied between a pair of top and bottom electrodes separated by the active film layer to form a low resistance state in one area portion (LRS area) or cell of the active film layer to write of an information bit to the cell.

FIG. 4B presents the same example electrical device after a voltage (e.g. a write voltage $U_{W\ TE2\text{-}BE2}$) is applied between a pair of top and bottom electrodes separated by the active film layer to form a low resistance state in one area portion (LRS area) or cell 132 of the active film layer 110 to write an information bit 1 to the cell, e.g., by switching resistivity in the cell from HRS (e.g., bit 0) to LRS (e.g., bit 1).

FIG. 4C presents the same example electrical device 100 with the resistance state of the cell being read, e.g., by using a lower voltage (e.g., a read voltage $U_{R\ TE\text{-}BE}$ where $U_{R\ TE2\text{-}BE2} < U_{W\ TE\text{-}BE}$) to read the state of resistivity of the cell.

FIG. 4D presents the same view of the example electrical device 100 as shown in FIG. 4C, after the low resistance state of the cell 132, is written to another cell 134, e.g., by applying a voltage (e.g., write voltage $U_{W\ TE3\text{-}BE3}$) between another pair of top and bottom electrodes 122, 120 (e.g., TE3, BE3) separated by another area portion of the active film layer 110 to form a same low resistance state in the other area portion (second LRS area) corresponding to the other cell 134.

Figure 4E:
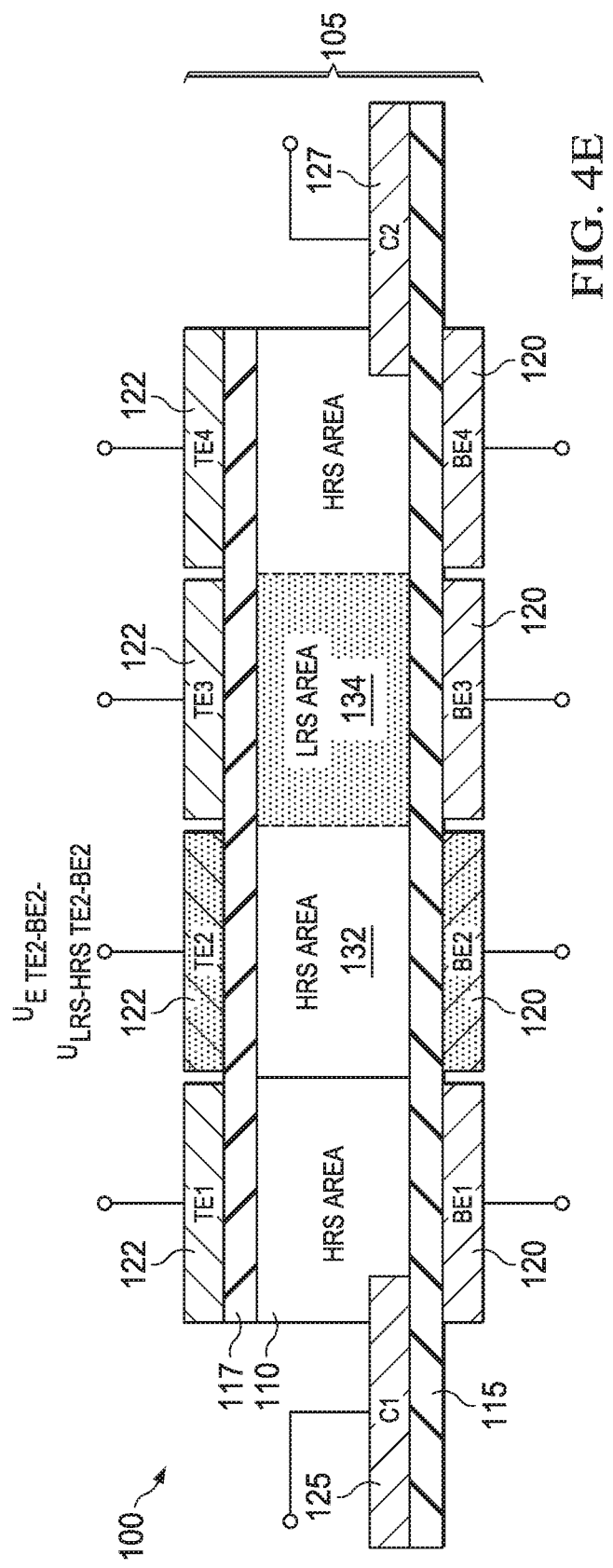
FIG. 4E presents the same view of the example electrical device as shown in FIG. 4D, after the low resistance state of the cell is erased, e.g., by applying a voltage, $U_{E\ TE2-BE2}$, between the pair of top and bottom electrodes separated by the area portion of the active film layer.

FIG. 4E presents the same view of the example electrical device 100 after the low resistance state of the cell 132 is erased, e.g., by applying a voltage (e.g., erase voltage $U_{E\ TE2\text{-}BE2}$) between the pair of top and bottom electrodes 122, 120 (e.g., TE2, BE2) separated by the area portion of the active film layer 110.

Figure 5A:
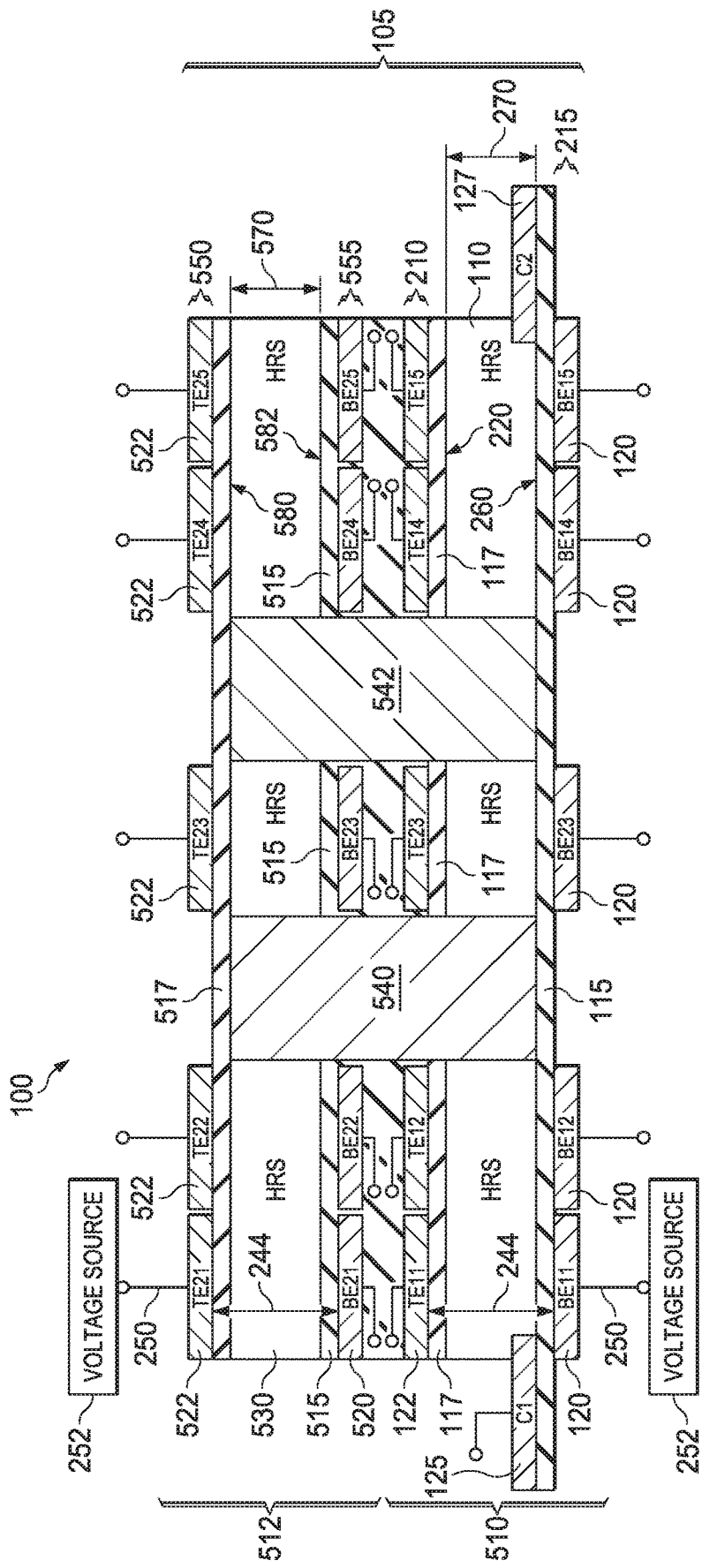
FIG. 5A presents a cross-sectional view of an example electrical device analogous to that shown in FIG. 1A, the device having a first set of pairs of top and bottom electrodes (e.g., TE11 and BE11, TE12 and BE12, etc. . . . ) separated by a first active film layer and a second set of pairs of top and bottom electrodes (e.g., TE21 and BE21, TE22 and BE22, etc. . . . ) separated by a second active film layer, the second active film layer interconnected to the first metamaterial layer by conductive vias, with no voltage applied to any of the pairs of electrodes resulting in high resistive states (HRS) in both of the first and second active film layers.
Figure 5B:
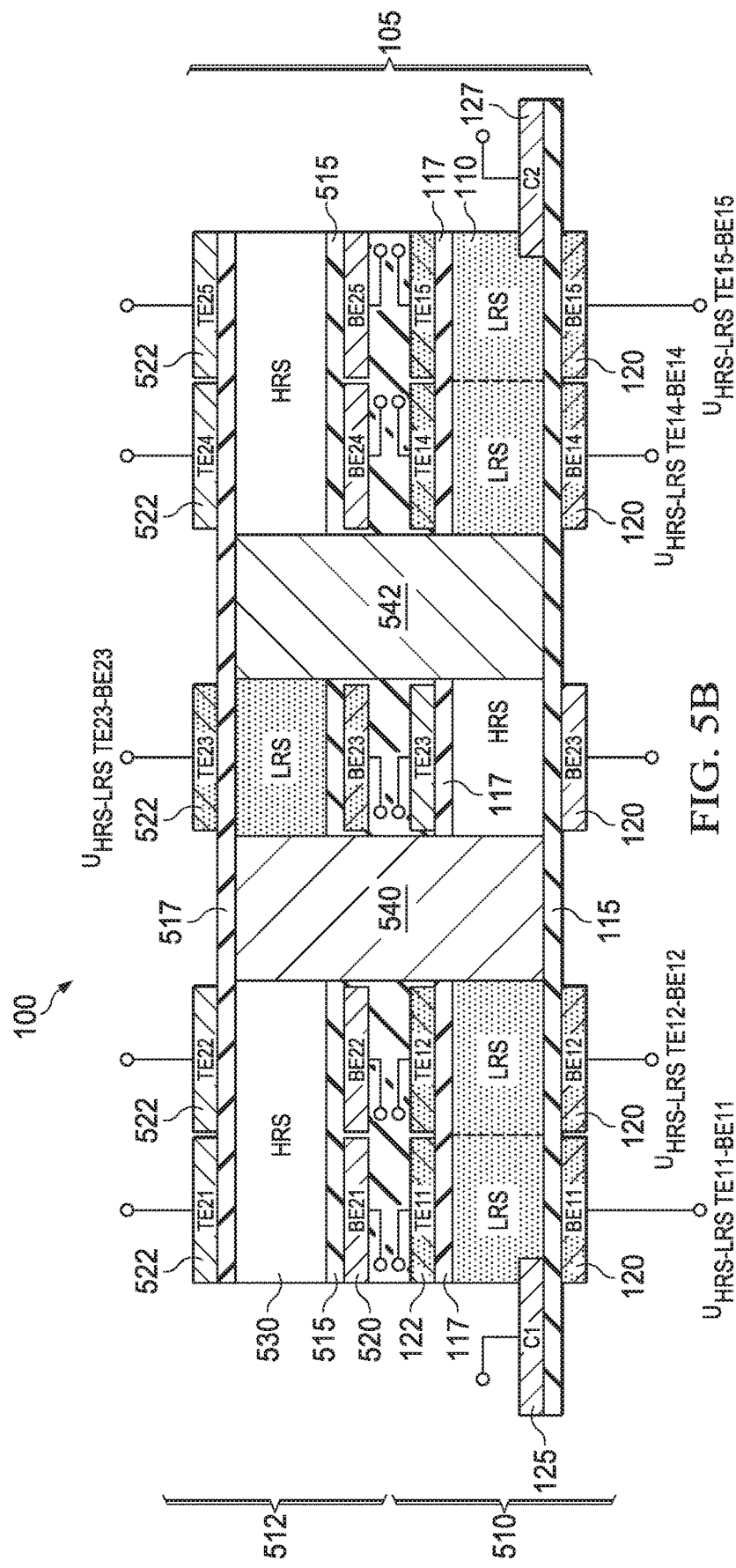
FIG. 5B presents the same view of the example electrical device as shown in FIG. 5A, with voltages (e.g., $U_{HRS\text{-}LHS}$) applied to TE11 and BE11, TE12 and BE12, TE14 and BE14, and TE15 and BE15 of the first set of pairs of electrodes, and applied to TE23 and BE23 of the second set of pairs of electrodes, to reconfigure portions of the active film layers between these electrode pairs from a high resistive state to a low resistance state (LHS)
Figure 5C:
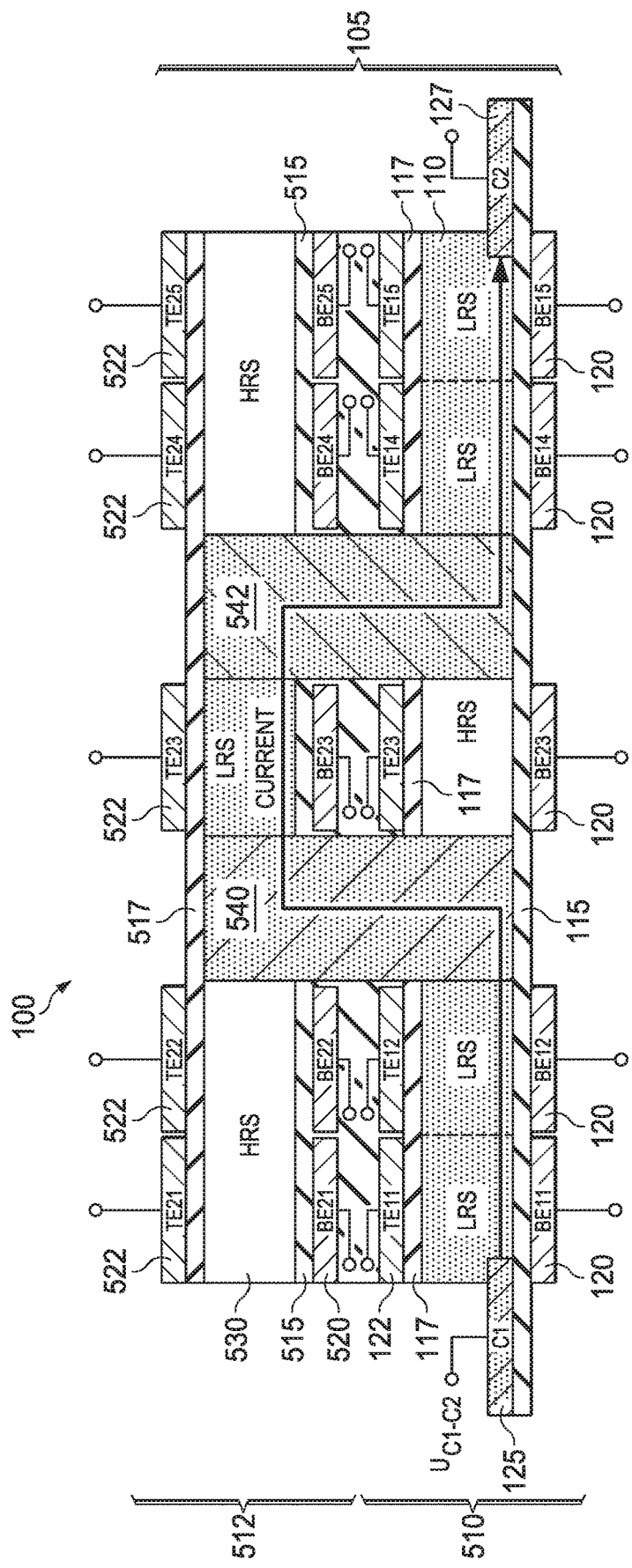
FIG. 5C presents the same view of the example electrical device as shown in FIG. 5B and further showing a current passing through the portions of the active film layers in the low resistance state from a first contact layer (C1) to a second contact layer (C2)

In some embodiments of the electrical device 100, as illustrated in FIGS. 5A-5C, to facilitate forming more complex circuit layouts (e.g., 3-dimension arrays of cells), the device 100 can include multiple active film layers. These layers can be connected to each other by conductive vias. This allows circuits 105 to be routed across cell in multiple layers and to achieve a high utilization. Such a configuration and its use are illustrated for two active film layers 110, 530 in FIGS. 5A-5C.

FIG. 5A presents a cross-sectional view of an example electrical device 100 analogous to that shown in FIG. 1A, the device comprising an integrated circuit 105 that includes a first set 510 of pairs of top and bottom electrodes 122, 120 (e.g., TE11 and BE11, TE12 and BE12, etc. . . . ) separated by a first active film layer 110 and a second set 512 of pairs of top and bottom electrodes 522, 520 (e.g., TE21 and BE21, TE22 and BE22, etc. . . . ) separated by a second active film layer 530, the second active film layer interconnected to the first metamaterial layer 110 by one or more conductive vias (e.g., interlayer vias 540, 542). Similar to that described in the context of FIGS. 1A-2D, a resistivity state (e.g., HRS or LRS) of portions of the active layers 110, 530 are independently changeable by a voltage applied to one or more of the paired top and bottom electrodes 120, 122, 520, 522 of the first set 510 or the second set 515.

As illustrated in FIG. 5A, some embodiments further include a first insulating layer 115 between the bottom electrodes 120 of the first set 510 and the first active layer 110, a second insulating layer 117 between the top electrodes 122 of the first set 510 and the first active layer 110, a third insulating layer 515 between the bottom electrodes 520 of the second set 512 and the second active layer 530 and a fourth insulating layer 517 between the top electrodes 522 of the second set 512 and the second active layer 530.

As illustrated in FIG. 5A, for some embodiments, each of the top and bottom electrodes 120, 122, 520, 522 of the first set and the second set 510, 512 are located in single rows (e.g., rows 210, 215, 550, 555).

In some such embodiments, the bottom electrodes 120 of the first set 510 are located on a first insulator layer 115 (e.g., in first row 215), the top electrodes 122 of the first set 510 are located on a second insulator layer 117 (e.g., in second row 210), the bottom electrodes 520 of the second set 512 are located on a third insulator layer 515 (e.g., in third row 555) and the top electrodes 522 of the second set 512 are located on a fourth insulator layer 517 (e.g., in fourth row 550).

As illustrated in FIG. 5A, in some embodiments, the top electrodes 122, 522 are non-overlapping and the bottom electrodes 120, 520 are non-overlapping. However in other embodiments, analogous to that shown in FIG. 2A, the top electrodes are distributed in two or more rows and the bottom electrodes are distributed in two or more rows parallel to the major plane of the first active layer or the second active layer. In some such embodiments, analogous to that shown and discussed in the context of FIG. 2A, the electrodes can have octagonal, hexagonal or other non-rectilinear shapes.

As illustrated in FIG. 5A, in some embodiments, the paired top and bottom electrodes 122, 120 of the first set 510 and the paired top and bottom electrodes 522, 520 of the second set 512 are separated from each other by a same distance 244. In some such embodiments, the first and second active layers 110, 530 have same thicknesses 270, 570 (e.g., within ±1%).

In some embodiments, the paired top and bottom electrodes 122, 120 of the first set 510 and the paired top and bottom electrodes 522, 520 of the second set 512 form two-dimensional arrays, e.g., such as depicted in FIG. 3A, over the top major surface 220 and bottom major surface 260 of the first active layer 110, and over the top major surface 580 and bottom major surface 582 of the second active layer 530, respectively. Such embodiments of the device 100 include a three dimensional array of reconfigurable cells.

As illustrated in FIG. 5A, embodiments of the device 100 can include including contact electrodes 125, 127 touching different portions of the at least one of the first active layer 110 or the second active layer 530. In some embodiments electrical contacts touch one of the first active layer 110 and the second active layer 530 or additional active layers if so configured.

As illustrated in FIG. 5A, each one of the top and bottom electrodes (top and bottom electrodes 122, 120 of the first set 510 and top and bottom electrodes 522, 520 of the second set 512) can be connected to separate leads 250.

As illustrated in FIG. 5A, the device 100 can include a voltage source 252 connected to each one of the top and bottom electrodes (top and bottom electrodes 122, 120 of the first set 510 and top and bottom electrodes 522, 520 of the second set 512) by electrical leads 250, the voltage source configured to apply the voltages to the paired top and bottom electrodes (e.g., any one or more of the paired electrodes TE11-BE11, TE12-BE12 . . . TE21-BE21, TE22-BE22 . . . ).

FIG. 5A shows the device 100 with no voltage applied to any of the paired electrodes, resulting, e.g., in high resistive states (HRS) in both of the first and second active film layers.

FIG. 5B presents the same view of the example electrical device with voltages (e.g., UHRS-LHS) applied to electrodes 120, 122 (e.g., TE11 and BE11, TE12 and BE12, TE14 and BE14, and TE15 and BE15) of the first set of pairs of electrodes 510, and applied to electrodes 520, 522 (e.g., TE23 and BE23) of the second set of pairs of electrodes 512, to reconfigure corresponding portions of the active film layer 110 (e.g., the portions between TE11 and BE11, TE12 and BE12, TE14 and BE14, and TE15 and BE15, respectively) and the active film layer 530 (e.g., the portion between TE23 and BE23) between these electrode pairs from a high resistive state (HRS) to a low resistance state (LRS).

FIG. 5C presents the same view of the example electrical device showing a current passing ("Current") through the portions of the active film layers 110, 530 and interlayer vias 540, 542 in the low resistance state from a first contact layer 120 (C1) to a second contact layer 127 (C2).

Figure 6A:
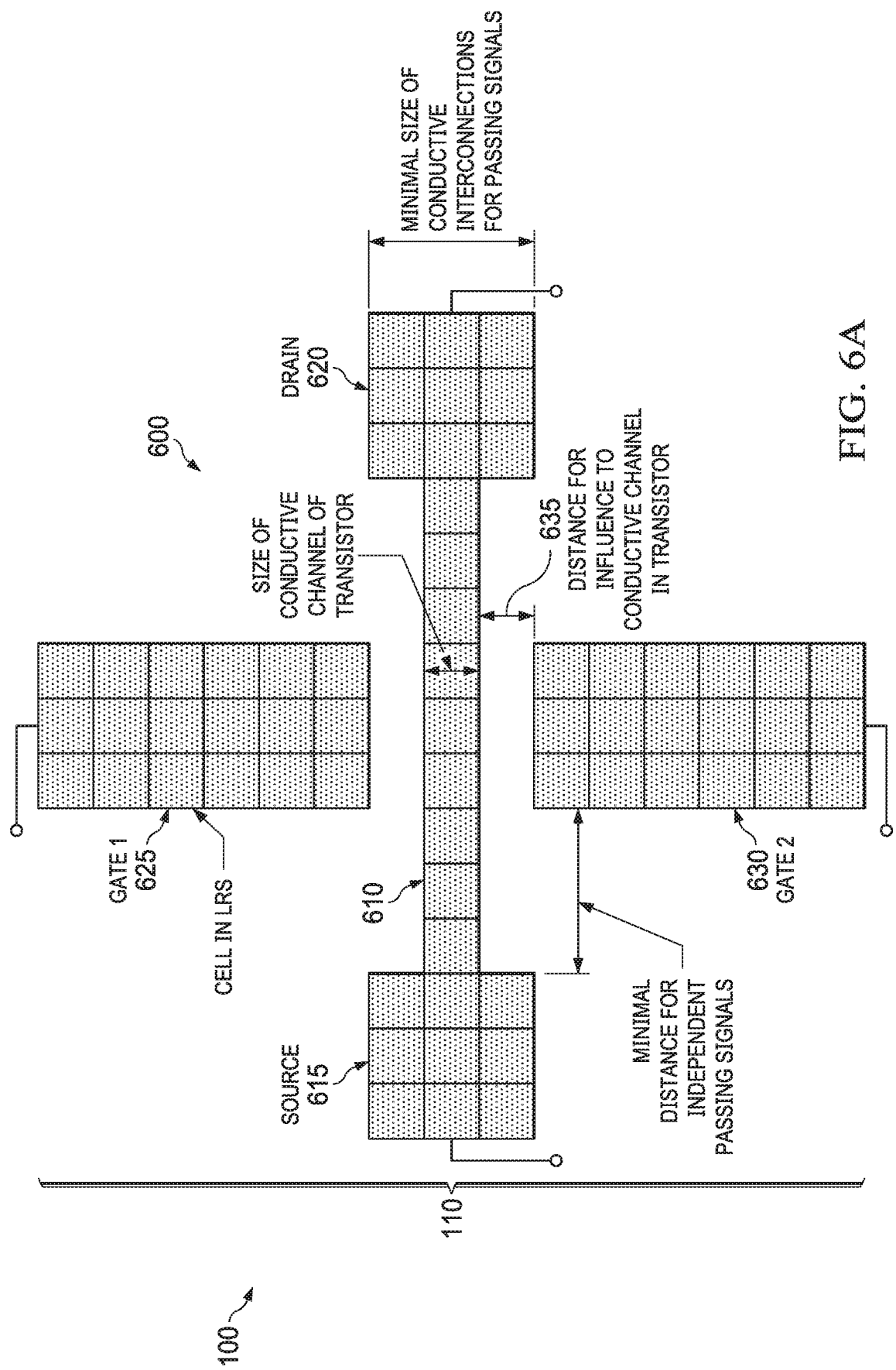
FIG. 6A presents a plan view schematic of an example transistor structure of the disclosure, the transistor structure including portions or cells of an active film layer that is between discrete separate pairs of top and bottom electrodes such as discussed in the context of FIGS. 1A-5C where all of the selected portions are configured to be in a low resistive state.
Figure 6B:
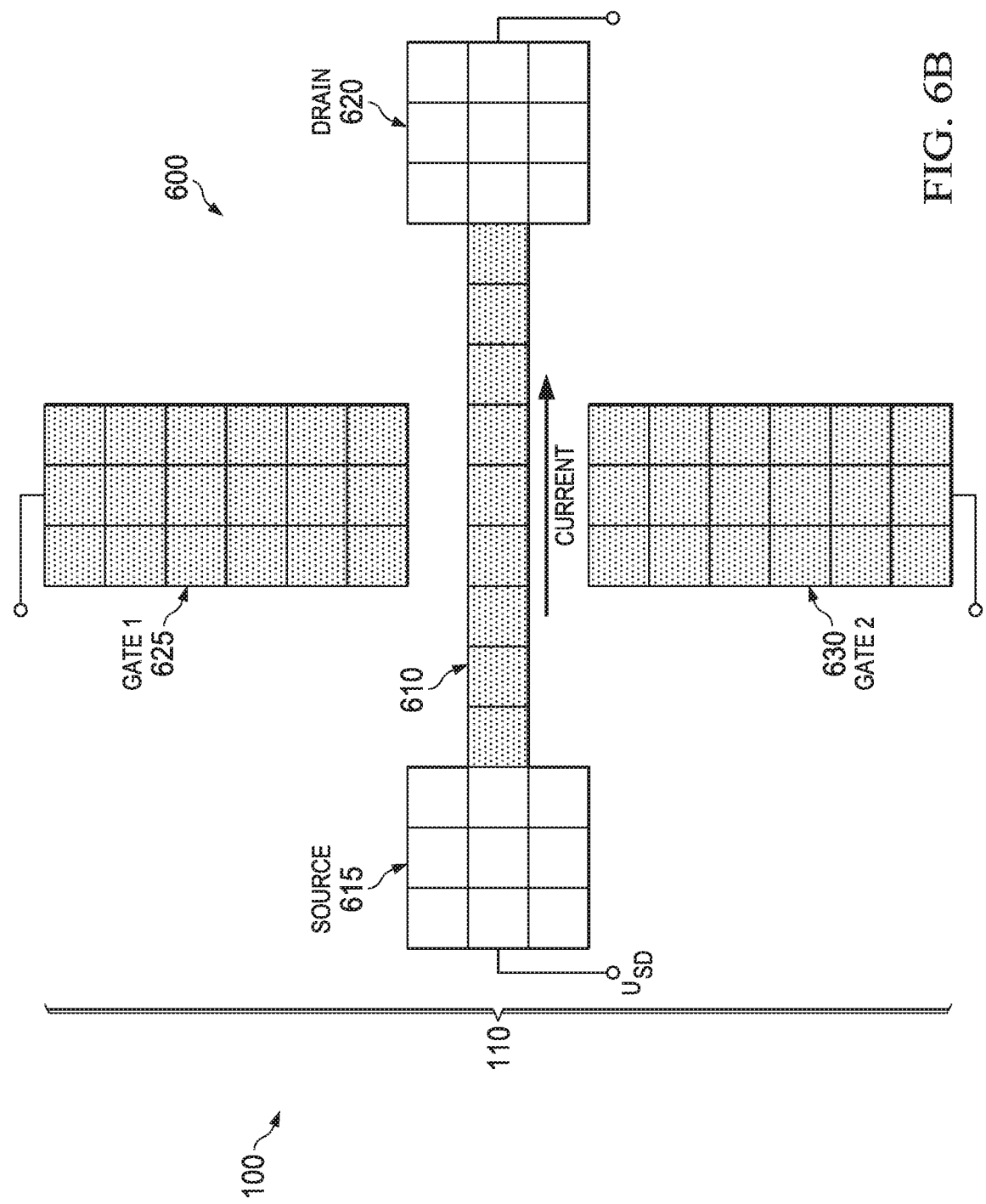
FIG. 6B presents the same view of the example transistor structure shown in FIG. 6A, where cells corresponding to source and drain structures of the transistor structure are configured to be in a high resistive state and a current is passed from the source to drain.
Figure 6C:
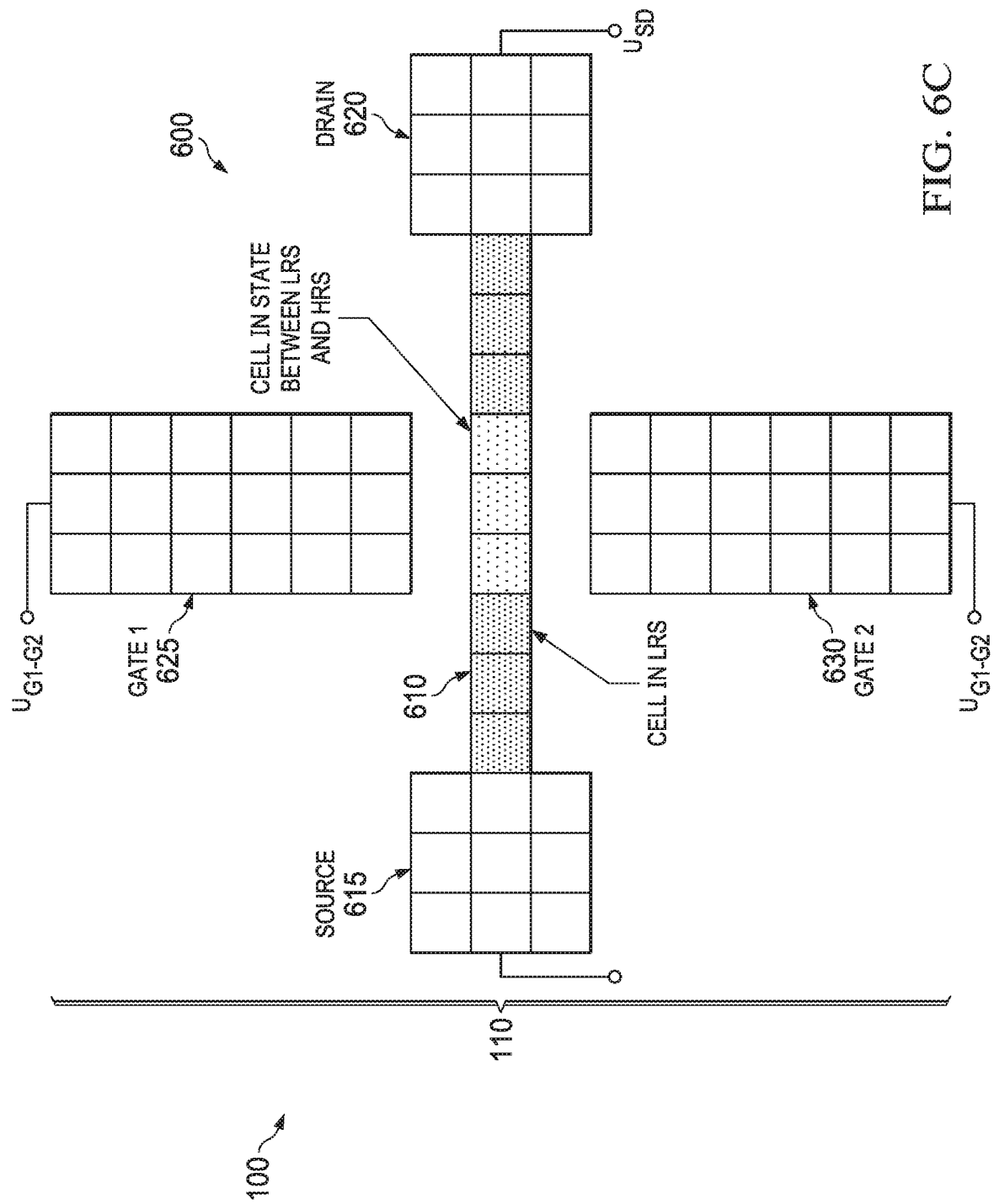
FIG. 6C presents the same view of the example transistor structure shown in FIG. 6B, where cells corresponding to source, drain and first and second gate structures of the transistor structure are configured to be in a high resistive state, cells between the source and drain but not between the gate structure are configured to be in a low resistive state and cells between the source and drain and between the gate structure are configured an intermediate resistive state that is intermediate in resistivity between the high and low resistive states.

In some embodiments of the electrical device, portions of the active film layer can be configured to a transistor structure. As disclosed herein, applying voltages between top and bottom electrodes changes the resistivity of cells. Similar effects during applying voltage laterally between cells configured as LRS areas can be used for changing resistivity of cells that are located between these nearest LRS areas. FIGS. 6A-6C present examples of such transistor structures.

FIG. 6A presents plan view schematic of an example transistor structure 600 of the disclosure, the transistor structure 600 including portions or cells of an active film layer 110 of the device 100 that are between discrete separate pairs of top and bottom electrodes such as discussed in the context of FIGS. 1A-5C where all of the selected portions are configured to be in a low resistive state.

As illustrated, in some embodiments, two sides of a thin conductive channel 610 can be used as source and drain structures 615, 620 two gates 625, 630 (e.g., Gate 1, Gate 2) can be located perpendicular to the thin conductive channel 610 at a distance 635 allowing use of a voltage applied between gates to change the resistivity of the channel Several physical effects can be used for the implementation of, e.g., changing of number of energy levels in quantum 1D structure of a thin conductive channel or producing lateral resistive switching effects.

FIG. 6B presents the same view of the example transistor structure 600 where cells corresponding to source and drain structures 615, 620 of the transistor structure 600 are configured to be in a high resistive state and a current ("Current") is passed from the source to drain 615, 620.

FIG. 6C presents the same view of the example transistor structure 600 where cells corresponding to source, drain 615, 620 and first and second gate structures 625, 630 of the transistor structure 600 are configured to be in a high resistive state, cells between the source and drain but not between the gate structure are configured to be in a low resistive state and cells between the source and drain and between the gate structure are configured an intermediate resistive state that is intermediate in resistivity between the high and low resistive states.

Figure 7:
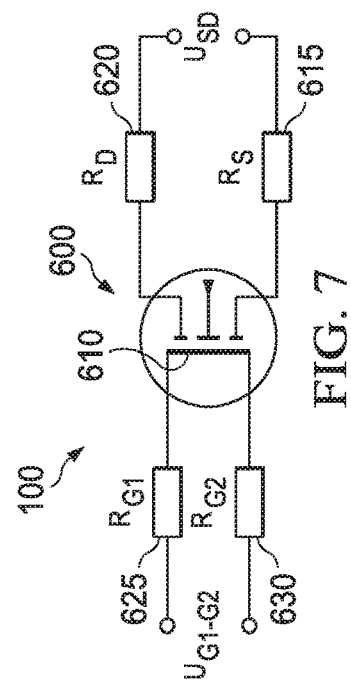
FIG. 7 presents an electric circuit diagram that is electrically equivalent to the transistor structure depicted in FIGS. 6A-6C.

FIG. 7 presents an electric circuit diagram that is electrically equivalent to the transistor structure 600 depicted in FIGS. 6A-6C, where e.g., for a voltage between the source and drain ($U_{SD}$) and between the first and second gate ($U_{G1-G2}$) the resistivity of the source 615 ($R_S$), drain 620 ($R_D$), first gate 625 ($R_{G1}$) and second gate ($R_{G2}$) can be altered according to the resistive state of the cells selected to define these components.

Some embodiments of the electrical device include a reconfigurable IC structure. An example of such a structure and its use is presented in FIGS. 8A-19.

Figure 9:
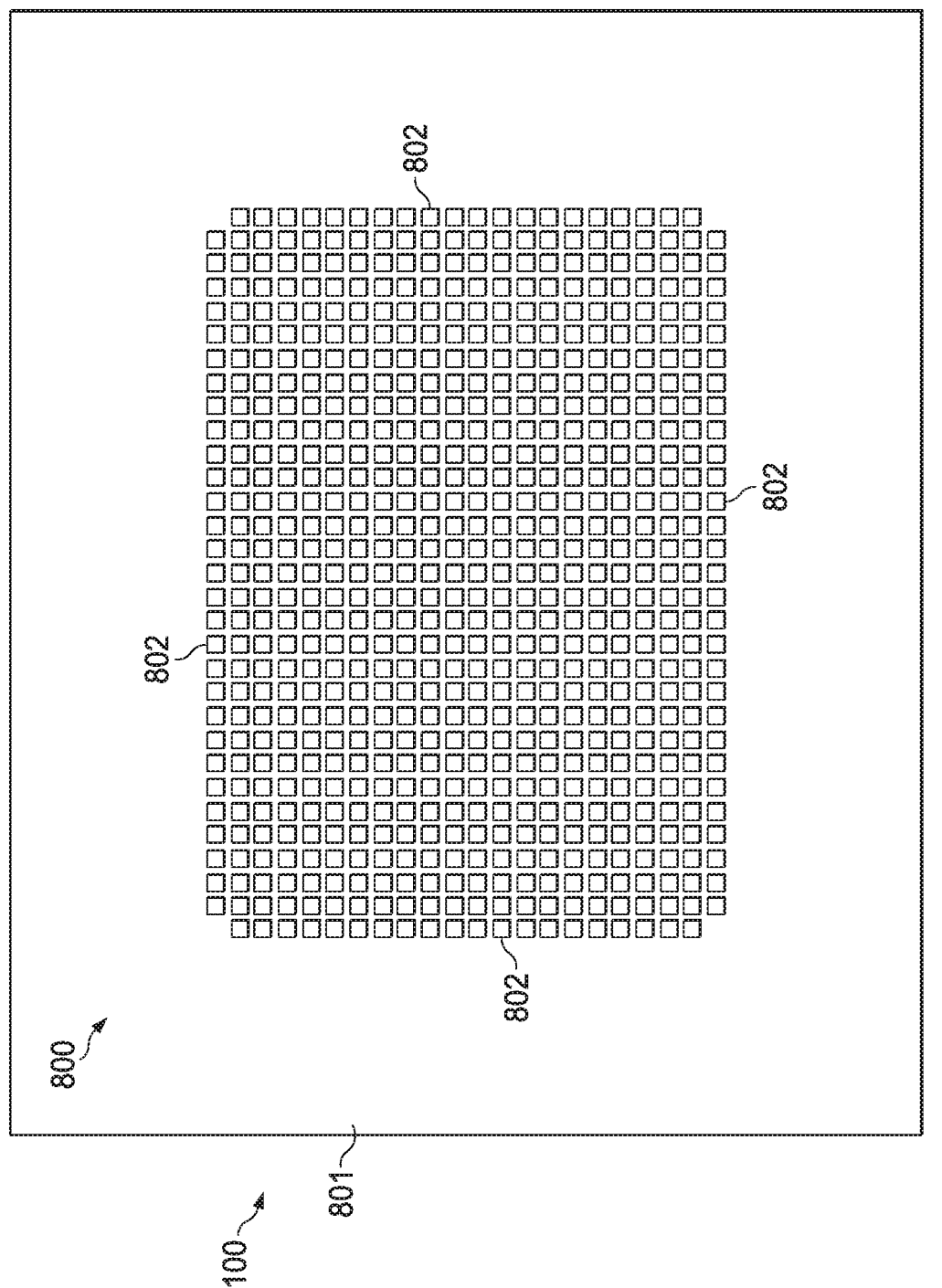
FIG. 9 presents a plan top view of the example reconfigurable integrated circuit depicted in FIG. 8B along view line B-B shown in FIG. 8B.
Figure 10:
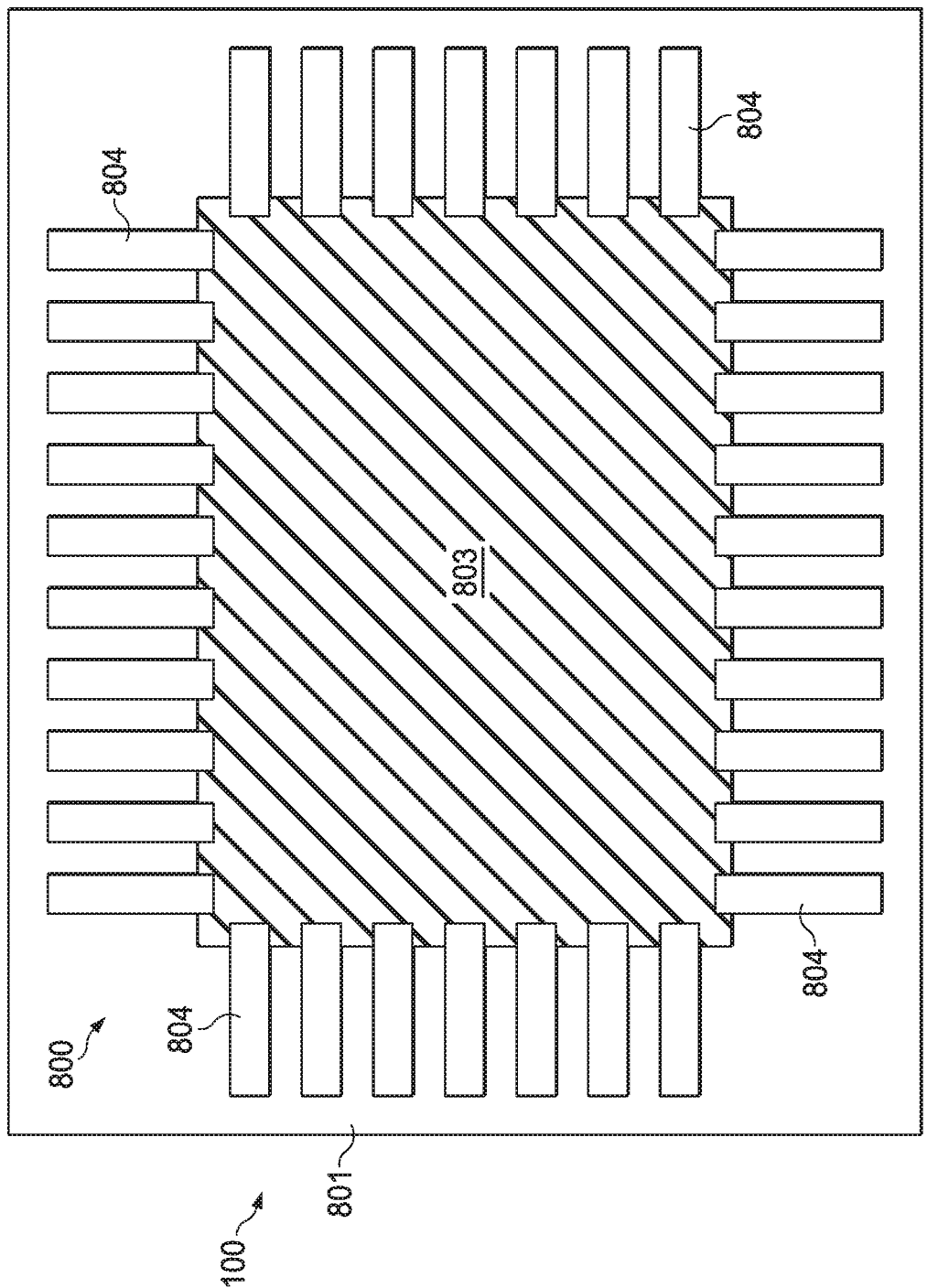
FIG. 10 presents a plan top view of the example reconfigurable integrated circuit depicted in FIG. 8B along view line C-C shown in FIG. 8B.
Figure 11:
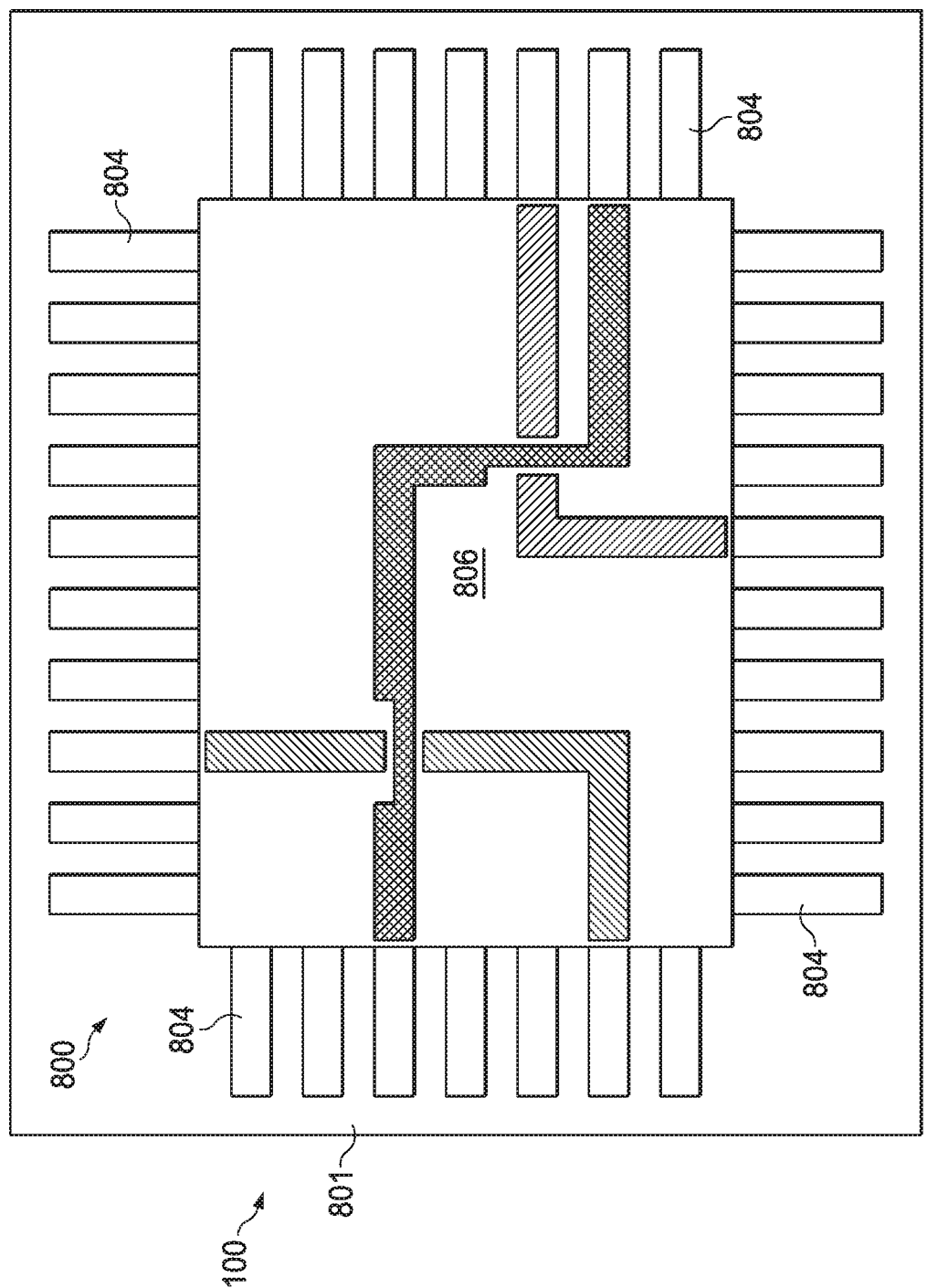
FIG. 11 presents a plan top view of the example reconfigurable integrated circuit depicted in FIG. 8B along view line D-D shown in FIG. 8B and showing conductive paths of an example IC layout defined by cells configured to have a low resistive state.

FIG. 8A presents a plan top view of an example reconfigurable integrated circuit 800 of the device 100 and FIG. 8B presents a cross-section view of the circuit 800 of the device 100 depicted in FIG. 8A, along view line A-A shown in FIG. 8A. FIG. 9 presents a plan top view of the circuit 800 of the device 100 depicted in FIG. 8B along view line B-B shown in FIG. 8B. FIG. 10 presents a plan top view of the circuit 800 of the device 100 depicted in FIG. 8B along view line C-C shown in FIG. 8B. FIG. 11 presents a plan top view of the circuit 800 of the device 100 depicted in FIG. 8B along view line D-D shown in FIG. 8B.

As illustrated in FIG. 8B, the circuit 800 can include an insulating substrate 801 and a layer of bottom electrodes 802 as further shown in FIG. 9. The circuit 800 can include a layer of contacts 804, separated from a layer of bottom electrodes 802 by an insulator layer 803 as further shown in FIG. 10. The circuit 800 can include an active film layer 806 as further shown in FIG. 11. The layer of bottom electrodes 802 can be separated from the layer of contacts 4 by an insulator layer 805. The layer of top electrodes 808 can be separated from the active film layer 806 by an insulator layer 807.

As disclosed herein, the active film layer 806 has a reversible resistive switching effect, under the influence of voltage applied between top and bottom electrodes, to form conductive paths of an example IC layout defined by cells (e.g., cells 130, 132, 134, 136 . . . , FIG. 1A) configured to have a low resistive state as further shown in FIG. 11.

Figure 12:
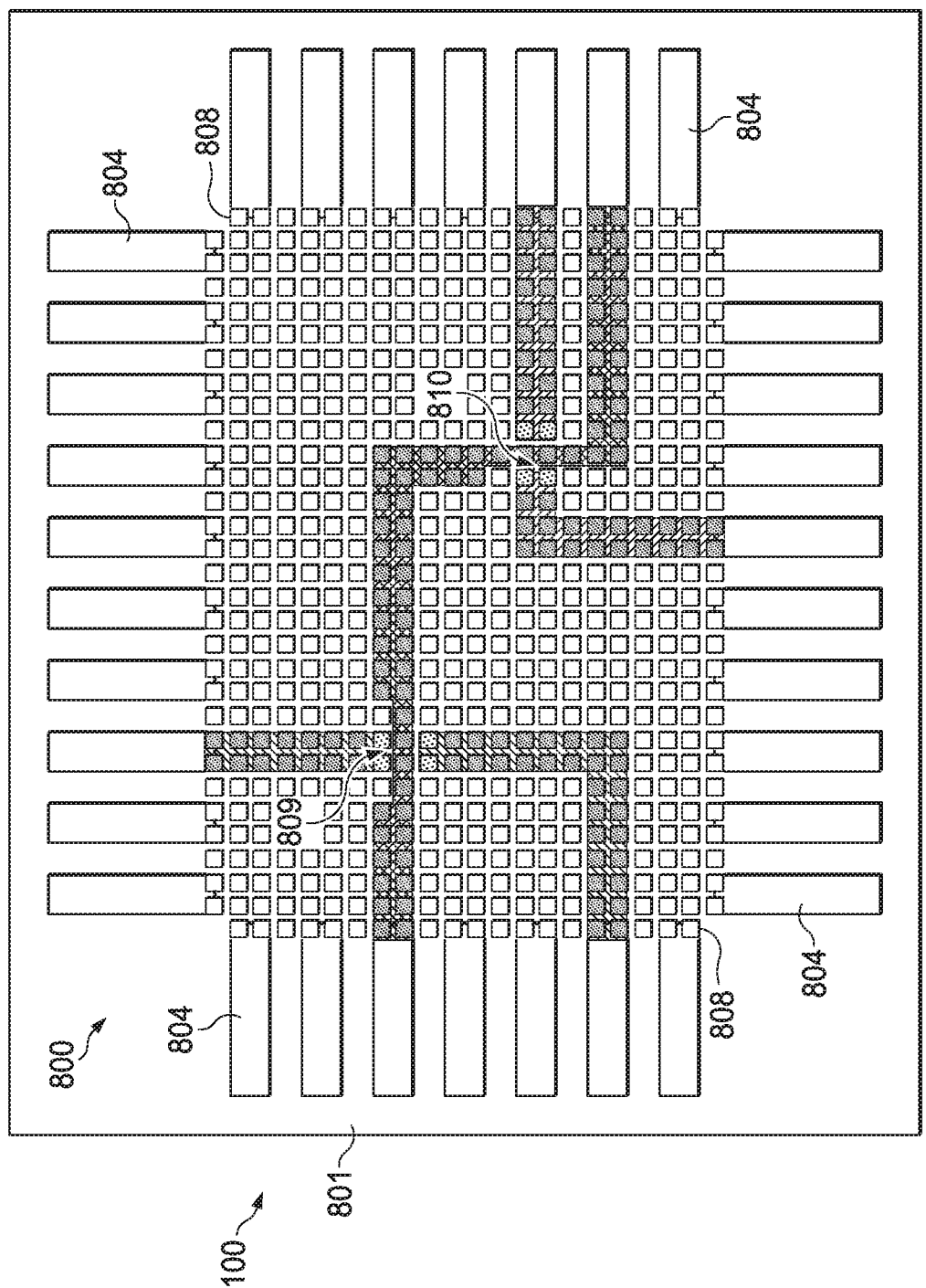
FIG. 12 presents the same plan top view of the example reconfigurable integrated circuit as shown in FIG. 11 and showing the specific cells to which voltages (e.g., $U_{HRS\text{-}LRS}$) have been applied, the cells corresponding portions of the active film layer, to locally change the resistivity of the corresponding portions of film from high to low resistivity states to define the example IC layout shown in FIG. 11.

FIG. 12 presents the same plan top view of the circuit 800 as shown in FIG. 11 and showing the specific cells to which voltages (e.g., $U_{HRS-LRS}$) have been applied, the cells corresponding portions of the active film layer, to locally change the resistivity of the corresponding portions of film from high to low resistivity states to define the conductive paths, including electron conductive channels 809, 810, of the example IC layout.

Figure 13:
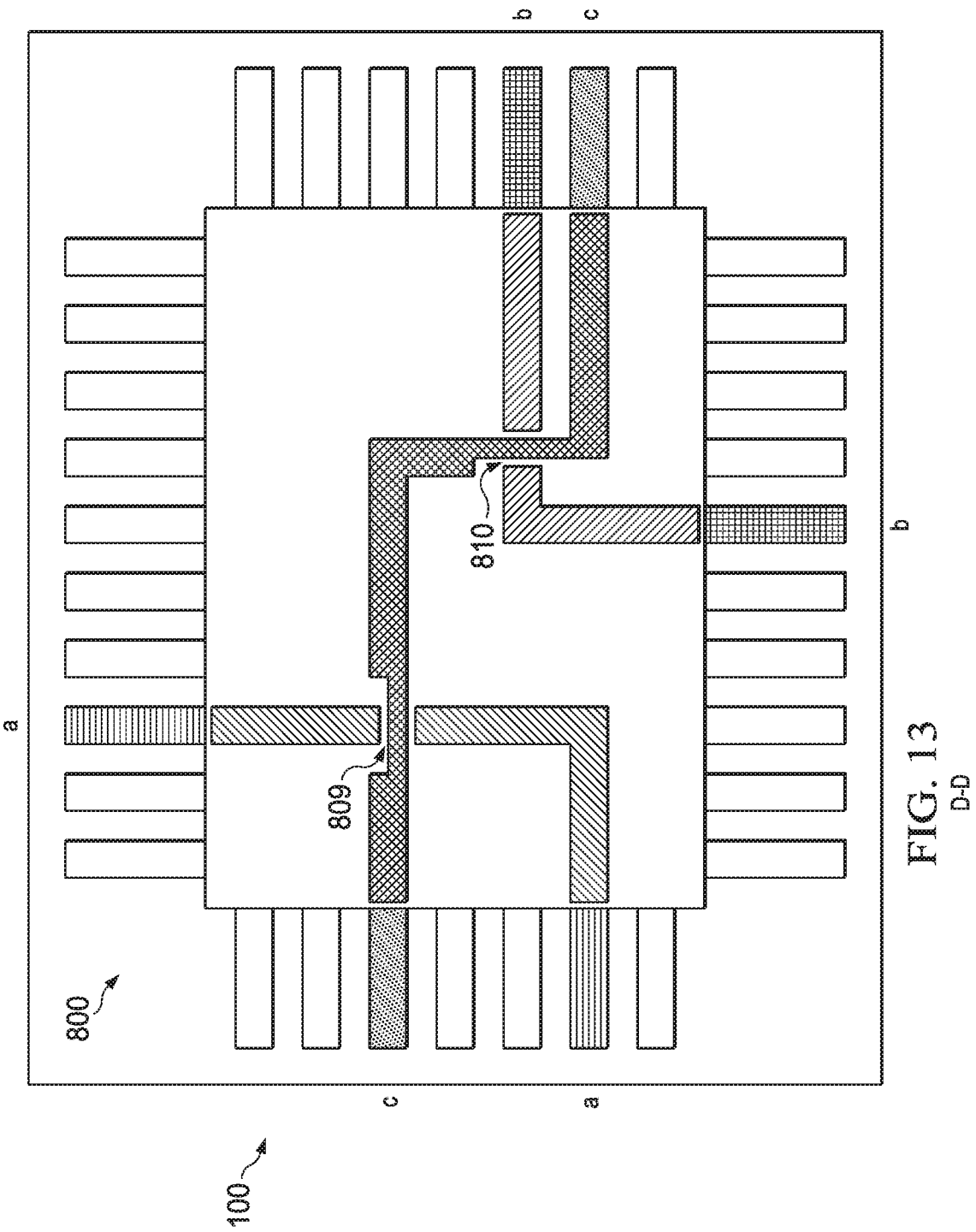
FIG. 13 presents the same plan top view of the example reconfigurable integrated circuit as shown in FIG. 12 and showing cells to which voltages have been applied via specific contacts to implement the logic function c=NOT (a OR b) in the example IC layout shown in FIG. 11.

FIG. 13 presents the same circuit 800 as shown in FIG. 12 showing cells to which voltages have been applied via specific pairs of contacts (e.g., a-a, b-b and c-c) to implement the logic function c=NOT (a OR b) in the example IC layout.

Figure 14:
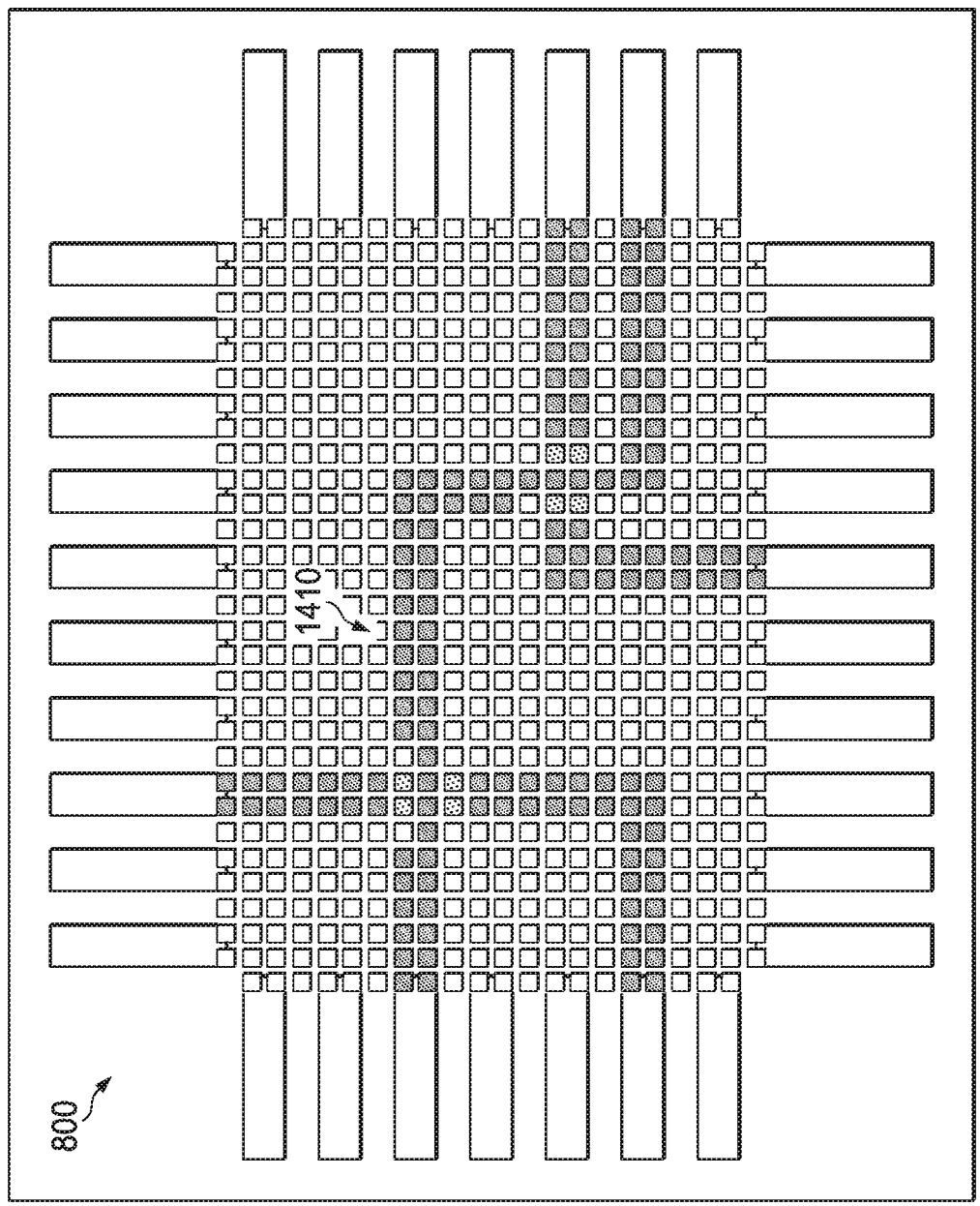
FIG. 14 presents the same plan top view of the example reconfigurable integrated circuit as shown in FIG. 13 and showing cells to which voltages have been applied specific electrode pairs to erase selected parts of the example IC layout shown in FIG. 11.

FIG. 14 presents the same circuit 800 as shown in FIG. 13 showing cells to which voltages (e.g., $U_{LRS-HRS}$) have been applied to specific electrode pairs to erase selected parts of the example IC layout, e.g., by changing the selected cells of the active film layer from low to high resistivity states to form a conductive pathway 1410.

Figure 15:
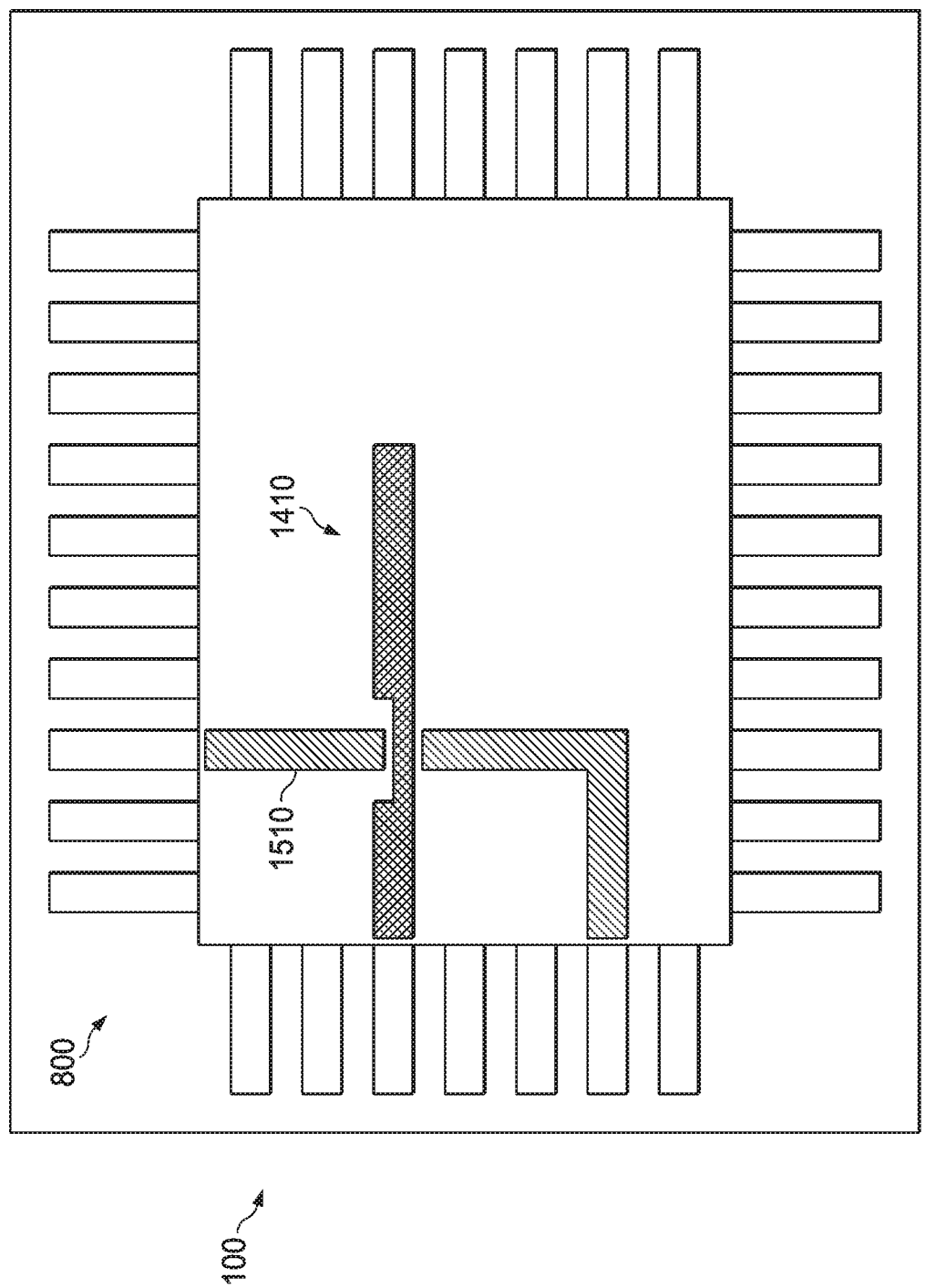
FIG. 15 presents the same plan top view of the example reconfigurable integrated circuit as shown in FIG. 14 and showing the remaining non-erased cells to which the voltage (e.g., $U_{HRS\text{-}LRS}$) had been previously applied to define the non-erased primordial part the IC layout shown in FIG. 11.

FIG. 15 presents the same plan top view of the circuit 800 as shown in FIG. 14 showing the remaining non-erased cells (e.g., cells 1510) to which the voltage (e.g., $U_{HRS-LRS}$) had been previously applied to define the non-erased primordial part of the conductive pathway 1410 of the IC layout.

Figure 16:
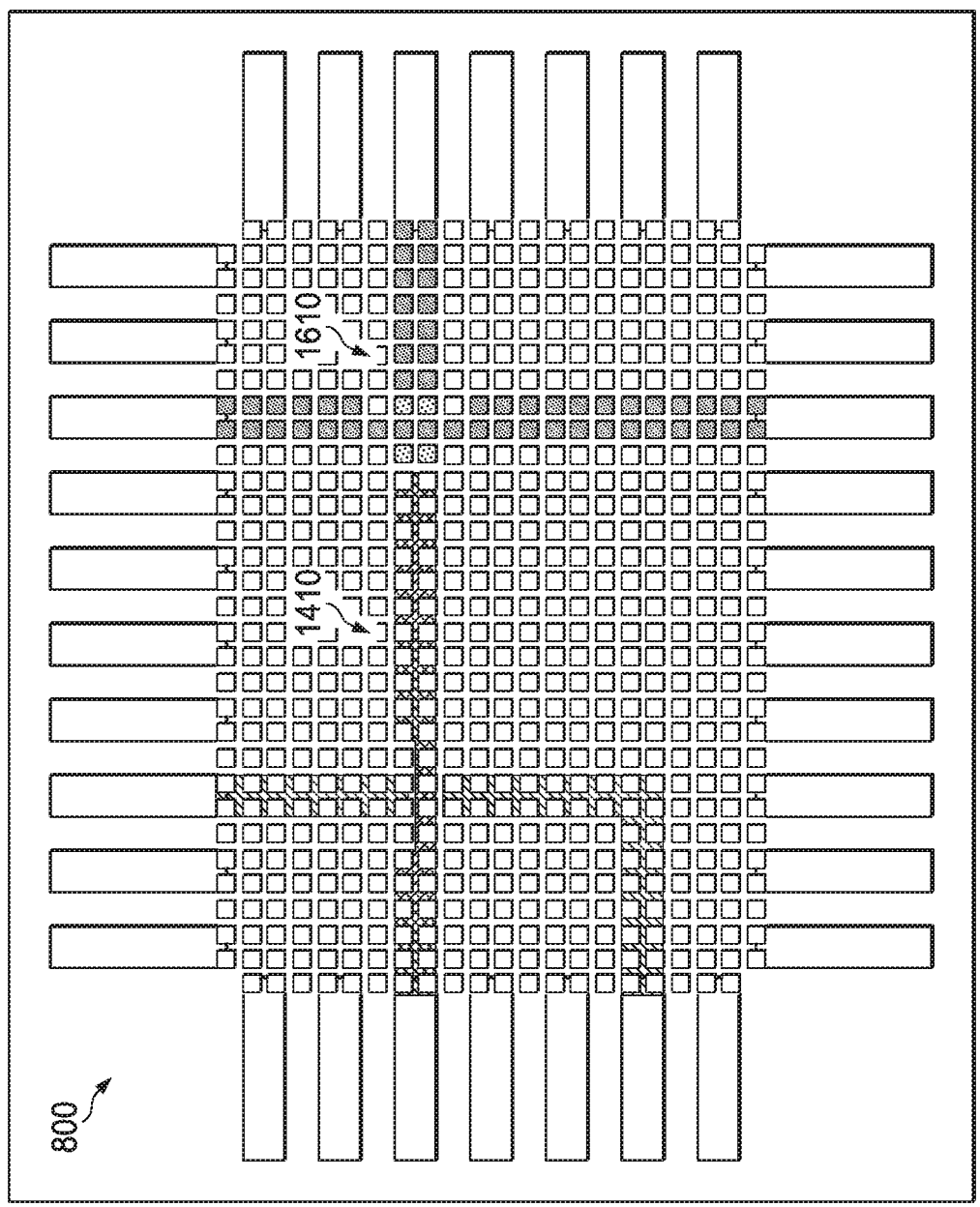
FIG. 16 presents the same plan top view of the example reconfigurable integrated circuit as shown in FIG. 15 showing additional different cells to which the voltage (e.g., $U_{HRS\text{-}LRS}$) has been applied, the cells corresponding different portions of the active film layer, to locally change the resistivity of the corresponding portions of film from high to low resistivity states to define different conductive pathways of a second example IC layout.

FIG. 16 presents the same plan top view of the example reconfigurable integrated circuit 800 as shown in FIG. 15 showing additional different cells to which the voltage (e.g., $U_{HRS-LRS}$) has been applied, the cells corresponding different portions of the active film layer, to locally change the resistivity of the corresponding portions of film from high to low resistivity states to define different conductive pathways 1610 of a second example IC layout.

Figure 17:
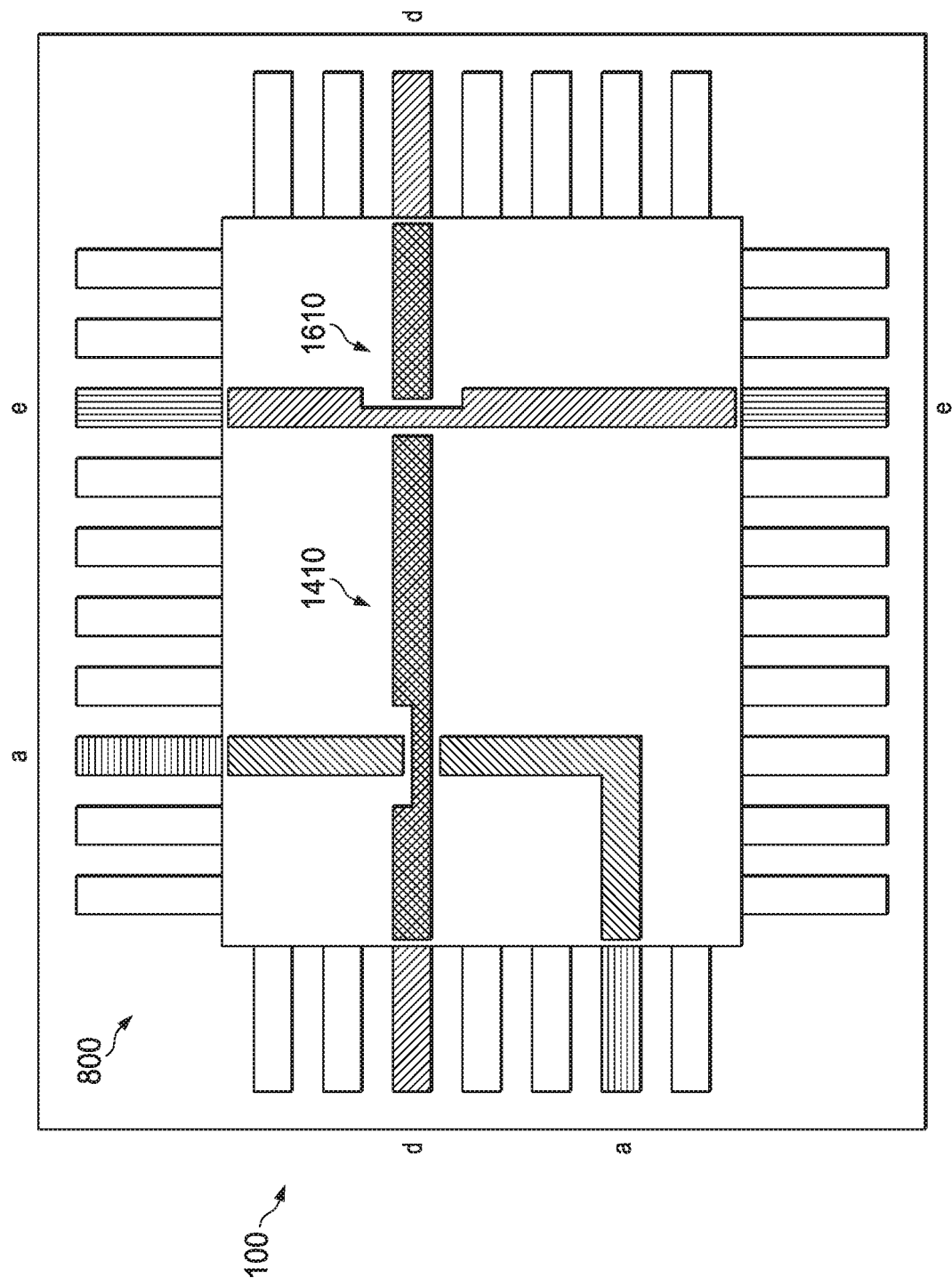
FIG. 17 presents the same plan top view of the example circuit as shown in FIG. 16 showing the cells after reconfiguration to define different conductive pathways of the second example IC layout.

FIG. 17 presents the same plan top view of the example circuit 800 as shown in FIG. 16 showing the cells after reconfiguration to define the different conductive pathways 1610 of the second example IC layout.

Figure 18:
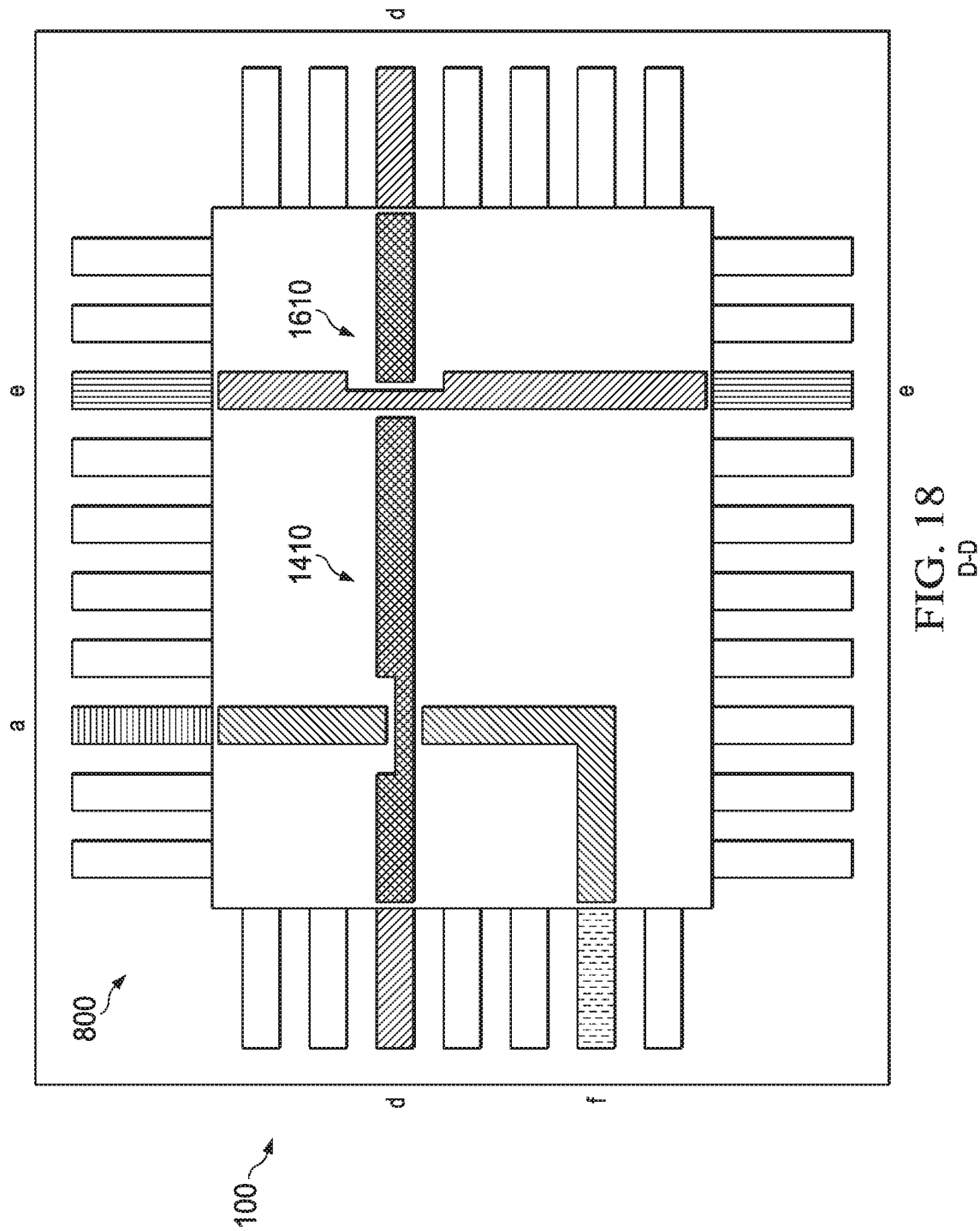
FIG. 18 presents the same plan top view of the example circuit as shown in FIG. 16 and showing cells to which voltages have been applied via specific pairs of contacts (e.g., a-a, d-d and e-e) to implement the logic function e=NOT d OR a AND d AND f in the different second example IC layout shown in FIG. 16.

FIG. 18 presents the same plan top view of the example circuit 800 as shown in FIG. 16 and showing cells to which voltages have been applied via specific pairs of contacts (e.g., a-f, d-d and e-e) to implement the logic function e=NOT d OR a AND d AND f in the different second example IC layout shown in FIG. 16.

To follow are example embodiments of the control and operation of the electrical with the reconfigurable IC 800, such as any of device disclosed in the context of FIGS. 12-18.

As disclosed in the context of FIG. 12 a target IC layout can be generated in the active film layer 6 by applying voltages (e.g., $U_{HRS\text{-}LRS\ TE\text{-}BE}$) between selected pairs of bottom electrodes 802 and top electrodes 808, to locally change the resistivity of portions of the layer 806 from insulating or HRS to conductive of LRS. This results in electrically conductive pathways, including electron conductive channels 809, 810 in the layer 806.

As a result, passive, active, and conductive elements can be formed. It should be noted that the number of contacts 804 and top electrodes 808 may be arbitrarily large depending on the complexity of target IC layout and the tasks (e.g., logic operations) the layout is designed to perform.

For instance, FIG. 13 illustrates an example implementation of the logic function c=NOT(a OR b) using the IC layout showed on FIG. 12. The truth table of the logic function c=NOT(a OR b) is shown in Table 1.

TABLE 1

The truth table of the logic function c = NOT (a OR b)

| a | b | c |
|---|---|---|
| 0 | 0 | 1 |
| 0 | 1 | 0 |
| 1 | 0 | 0 |
| 1 | 1 | 0 |

Applying voltages between the contacts a-a, it is possible to control electrical properties of an electron conductive channel 809 and correspondingly the conductivity of an electron conductive channel between contacts c-c. Similarly, applying voltage between the contacts b-b, it is possible to control electrical properties of a part of an electron conductive channel 810 and correspondingly the conductivity of an electron conductive channel 809 between contacts c-c. Thus, the voltage between the contacts c-c is a logic function depending on the voltage between the contacts a-a and the voltage between the contacts b-b.

Changing the IC layout, to perform new tasks, can occur in two stages. With continuing reference to FIG. 8B, FIG. 14 illustrates aspects of the first stage of reconfiguration of an IC layout in the active film layer 806 where voltages (e.g., $U_{LRS\text{-}HRS\ TE\text{-}BE}$) have applied between specific pairs of bottom electrodes 802 and top electrodes 808, to change the resistivity of portions of the layer 806 from conductive or LRS to insulating or HRS, thus erasing of specific parts of the first IC layout shown in FIG. 13.

With continuing reference to FIG. 8B, FIG. 15 illustrates aspects of the result of the first stage of reconfiguration of the IC layout in the layer 806 implements as described in the context of FIG. 14 whereby part of the first IC layout shown on FIG. 13 has been erased.

With continuing reference to FIG. 8B, FIG. 16 illustrates aspects of the result of the second stage of reconfiguration of the IC layout in the layer 806 by applying voltages (e.g., $U_{HRS\text{-}LRS\ TE\text{-}BE}$) between specific pairs of bottom electrodes 802 and top electrodes 808, to locally change resistivity of the portions of the layer 806 to conductive or LRS values, thereby specific additional parts of a new second IC layout.

FIG. 17 illustrates an example of implementation of the logic function e=NOT (NOT a AND d) using the second IC layout resulting from reconfiguration of the IC layout as described in the context of FIGS. 14-16. The truth table of the logic function e=NOT (NOT a AND d) is shown in Table 2.

TABLE 2

The truth table of the logic function e = NOT (NOT a AND d)

| a | d | e |
|---|---|---|
| 0 | 0 | 1 |
| 0 | 1 | 0 |
| 1 | 0 | 1 |
| 1 | 1 | 1 |

As illustrated in FIG. 18 the same second IC layout shown in FIG. 17 can alternatively implement logic function e=NOT d OR a AND d AND f if, instead applying the same signal on contacts a and f, two separate signals are applied to contacts a and f. The truth table of the logic function e=NOT d OR a AND d AND f is shown in Table 3.

TABLE 3

The truth table of the logic function e = NOT d OR a AND d AND f

| a | d | f | e |
|---|---|---|---|
| 0 | 0 | 0 | 1 |
| 0 | 0 | 1 | 1 |
| 0 | 1 | 0 | 0 |
| 0 | 1 | 1 | 0 |
| 1 | 0 | 0 | 1 |
| 1 | 0 | 1 | 1 |
| 1 | 1 | 0 | 0 |
| 1 | 1 | 1 | 1 |

Figures 19, 20:
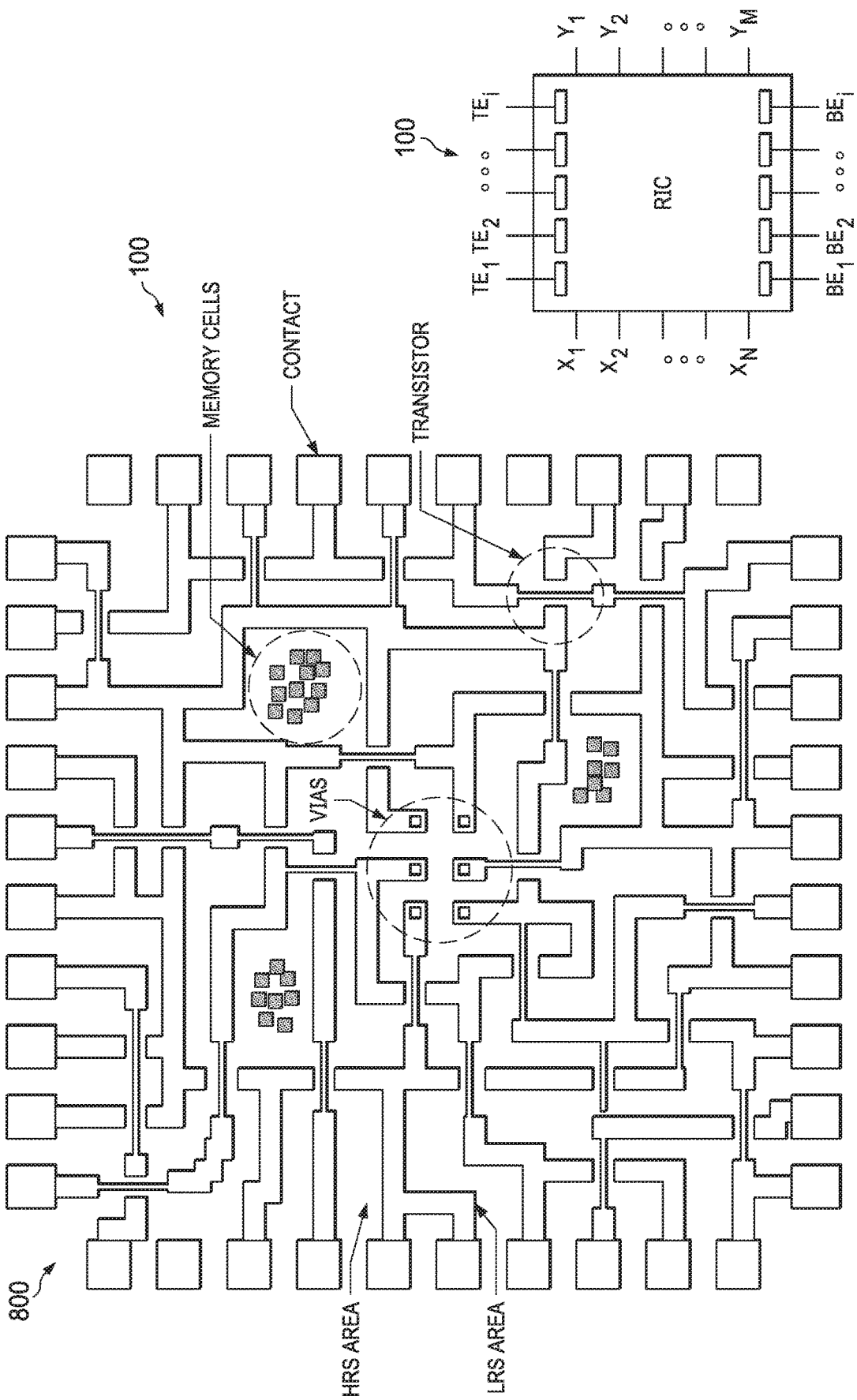
FIG. 19 presents a plan top view of an example reconfigurable integrated circuit similar to that depicted in FIG. 11, shown another example IC layout having memory cells, vias and transistor elements.
FIG. 20 presents an electrical circuit block diagram that is electrically equivalent to the example IC layouts of the reconfigurable IC such as depicted in FIGS. 12-19.

FIG. 19 presents a plan top view of an example reconfigurable integrated circuit 800 similar to that depicted in FIG. 11, the example IC layout having conductive paths (e.g., LRS areas), insulating areas (e.g., HRS areas), memory cells, vias and transistor elements. Based upon the present disclosure one skilled in the pertinent arts would appreciate how such a layout could be rapidly reconfigured to a different layout of vias and other elements.

FIG. 20 presents an electrical circuit block diagram that is electrically equivalent to the example IC 800 layouts of the reconfigurable IC such as depicted in FIGS. 12-19.

As illustrated by these examples, the reconfigurable IC of the electrical device is capable of transforming from one configuration to another one depending on solving real-time tasks. Based on the present disclosure one skilled in the pertinent arts would understand how to form IC layouts having any number of different types of passive, active, and conductive elements as well as multiple change the number and types of logical elements and its interconnections.

Although the present disclosure has been described in detail, those skilled in the art should understand that they can make various changes, substitutions and alterations herein without departing from the scope of the disclosure.

What is claimed is:

1. An electrical device, comprising:
    a reconfigurable integrated circuit, including:
        paired top electrodes and bottom electrodes separated from each other by an active layer, wherein:
            the top electrodes are distributed in two or more rows parallel to a major planar surface of the active layer, each of the rows of top electrodes having different separation distances from the active layer along a dimension perpendicular to the major plane, the bottom electrodes are distributed in two or more rows parallel to the major plane of the active layer, each of the rows of bottom electrodes having different separation distances from the active layer along the dimension perpendicular to the major plane, and a resistivity state of portions of the active layer are independently changeable by a voltage applied to one or more of the paired top and bottom electrodes.

2. The device of claim 1, wherein:

edges of adjacent ones of the top electrodes in the rows of top electrodes overlap in the dimension perpendicular to the major plane, and edges of adjacent ones of the bottom electrodes in the rows of bottom electrodes overlap in the dimension perpendicular to the major plane.

3. The device of claim 1, wherein the top electrodes and bottom electrodes have a similar shape in planes parallel to their respective rows.

4. The device of claim 1, wherein the top electrodes and bottom electrodes have an octagonal shape in planes parallel to their respective rows.

5. The device of claim 1, further including a first insulating layer between the bottom electrodes and the active layer and a second insulating layer between the top electrodes and the active layer.

6. The device of claim 5, wherein the first row of top electrodes is located on the second insulator layer and the second row of top electrodes is located in the second insulator layer and the first row of bottom electrodes is located in the first insulator layer and the second row of bottom electrodes is located on the first insulator layer.

7. The device of claim 1, wherein at least some of the paired top and bottom electrodes are separated from each other by a same distance.

8. The device of claim 7, wherein the paired top and bottom electrodes include the top electrodes of the second row and the bottom electrodes of the second row, and, the top electrodes of the first row and the bottom electrodes of the first row.

9. The device of claim 1, the paired top electrodes form a two-dimensional array over the top major surface and the paired bottom electrodes form a two-dimensional array over the bottom major surface of the active layer, respectively.

10. The device of claim 1, further including contact electrodes on different portions of the active layer.

11. The device of claim 1, wherein each one of the top and bottom electrodes is connected to a respective electrical lead.

12. The device of claim 1, further including a voltage source connected to the paired top and bottom electrodes by electrical leads, the voltage source configured to apply the voltages to the paired top and bottom electrodes.

\* \* \* \* \*